US008093961B2

(12) United States Patent
Kawamoto et al.

(10) Patent No.: US 8,093,961 B2
(45) Date of Patent: Jan. 10, 2012

(54) DUPLEXER FORMED ON PIEZOELECTRIC SUBSTRATE

(75) Inventors: Toshihiko Kawamoto, Sayama (JP); Susumu Yoshimoto, Sayama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 323 days.

(21) Appl. No.: 12/459,497

(22) Filed: Jul. 2, 2009

(65) Prior Publication Data
US 2010/0007435 A1 Jan. 14, 2010

(30) Foreign Application Priority Data
Jul. 9, 2008 (JP) ................................ 2008-179309

(51) Int. Cl.
H03H 9/70 (2006.01)
H03H 9/72 (2006.01)

(52) U.S. Cl. ........................ 333/133; 333/193; 333/195

(58) Field of Classification Search .................. 333/133, 333/193, 195
See application file for complete search history.

(56) References Cited

U.S. PATENT DOCUMENTS

| 5,592,135 | A | 1/1997 | Taguchi et al. | |
|---|---|---|---|---|
| 6,943,649 | B2 * | 9/2005 | Takeda | 333/193 |
| 7,196,594 | B2 * | 3/2007 | Cheema et al. | 333/133 |
| 7,298,231 | B2 * | 11/2007 | Ikuta et al. | 333/133 |
| 2005/0285700 | A1 | 12/2005 | Koga et al. | |
| 2006/0022768 | A1 | 2/2006 | Yokota et al. | |
| 2006/0028298 | A1 | 2/2006 | Nakamura et al. | |
| 2009/0096551 | A1 | 4/2009 | Yamagata | |

FOREIGN PATENT DOCUMENTS

| JP | 7-212183 | 8/1995 |
|---|---|---|
| JP | 2002-368572 | 12/2002 |
| JP | 2006-157174 | 6/2006 |
| JP | 2007-189501 | 7/2007 |
| JP | 2007-258832 | 10/2007 |
| WO | WO-2007/114390 | 10/2007 |

* cited by examiner

*Primary Examiner* — Barbara Summons
(74) *Attorney, Agent, or Firm* — Jordan and Hamburg LLP

(57) ABSTRACT

To provide a duplexer which is small in size and excellent in separation characteristic of transmission/reception signals. An antenna port is disposed on a center of a rearward side in a disposition area of a duplexer, a high band side filter and a low band side filter are respectively disposed on a left side and a right side of the antenna port, a parallel arm at a last stage in the low band side filter, a parallel arm at a last stage in the high band side filter, a first signal port and a second signal port seen from the antenna port are positioned on a forward side of the antenna port, a ground side of a parallel arm on a front stage side of the parallel arm at the last stage in the low band side filter and a ground side of a parallel arm on a front stage side of the parallel arm at the last stage in the high band side filter are mutually connected via a conductive path formed on a piezoelectric substrate at a rearward side of the antenna port, and the parallel arms connected by the conductive path are positioned on the rearward side of the parallel arms at the last stages. Accordingly, a separation characteristic at a high band side is improved.

6 Claims, 18 Drawing Sheets

(a)

(b)

(a)

ELECTRODE PART 7
IDT ELECTRODE PORTION 71
REFLECTOR 72
ELECTRODE FINGER
d1

(b)

ELECTRODE PART 7
IDT ELECTRODE PORTION 71
REFLECTOR 72

Related Art

# DUPLEXER FORMED ON PIEZOELECTRIC SUBSTRATE

BACKGROUND OF THE INVENTION

1. Field of the Invention

The present invention relates to a duplexer that separates and extracts a transmission signal and a reception signal having different frequencies, to conduct transmission/reception using a common antenna.

2. Description of the Related Art

A device having a two-way radio communication function such as a cellular phone, and a radio communication system using this type of device as a communication terminal can conduct transmission/reception using one antenna included in the communication terminal, so that they provide a difference between a frequency of a transmission radio wave and a frequency of a reception radio wave and separate a transmission signal and a reception signal in a duplexer using the frequency difference.

A duplexer is formed of a receiving-side filter that selects a frequency of a reception radio wave and outputs the radio wave to a reception processing section in a device, and a transmitting-side filter that selects a frequency of a transmission signal from a transmission processing section in the device and outputs the signal to an antenna, and has a center frequency different from that of the receiving-side filter.

FIG. 13 shows a configuration example of a generally used duplexer 100. In the duplexer 100 in this example, a high band side filter 4 that selects a frequency of a reception radio wave (for example, center frequency $f_R$=2,140 MHz) and outputs the radio wave to a reception processing section (illustration is omitted) in a device and a low band side filter 3 that filters (selects a frequency of) a transmission signal (for instance, center frequency $f_T$=1,950 MHz) from a transmission processing section (illustration is omitted) in the device and applies the signal to an antenna port 2, are integrally provided with respect to one antenna port 2.

As above, the duplexer 100 is formed of the low band side filter 3 and the high band side filter 4 connected in parallel with respect to the antenna port 2, in which it exhibits a high band side filter characteristic 112 that includes a high band side frequency pass band 115 shown in FIG. 17 with respect to a received current that flows between the antenna port 2 and a high band side filter port 6 (which corresponds to an output port of the high band side filter 4) provided at an outlet of the high band side filter 4, and exhibits a low band side filter characteristic 111 that includes a low band side frequency pass band 114 with respect to a transmitted current that flows between a low band side filter port 5 (which corresponds to an input port of the low band side filter 3) at an inlet portion of the low band side filter 3 and the antenna port 2. Further, by improving an isolation characteristic (separation characteristic) 113 in which no frequency pass band exists between the low band side filter port 5 and the high band side filter port 6 in the two filters 3 and 4, the transmission/reception signal is designed not to flow into the filters 3 and 4 in the direction opposite to the designed direction.

Some of the low band side filter 3 and the high band side filter 4 composing the duplexer 100 having such a function adopt a ladder-type filter that connects small-sized and low-loss elastic wave resonators such as, for instance, SAW (Surface Acoustic Wave) resonators in a ladder shape (type). For example, the low band side filter 3 shown in FIG. 13 is formed of a six-stage ladder-type filter in which three series arms 31a, 31b and 31c each formed of the elastic wave resonator are serially coupled in this order from the low band side filter port 5 toward the antenna port 2, and parallel arms 32a, 32b and 32c each formed of the elastic wave resonator are respectively connected to a front stage of the series arm 31a, between the series arms 31a and 31b respectively positioned on a first stage and a second stage, and between the series arms 31b and 31c respectively positioned on the second stage and a third stage.

Meanwhile, the high band side filter 4 shown in FIG. 13 is also formed of a six-stage ladder-type filter in which series arms 41a, 41b and 41c each formed of the elastic wave resonator are serially coupled in this order from the antenna port 2 toward the high band side filter port 6, and parallel arms 42a to 42c formed of the elastic wave resonators are respectively coupled between the respective series arms and to a rear stage of the series arm 41c in the same manner as in the low band side filter 3. Specifically, each of the low band side filter port 5 side and the high band side filter port 6 side in the respective filters 3 and 4 is configured as a π-type circuit in which the parallel arms are connected to the series arms in the directions of the respective filter ports 5 and 6 sides, and each of the parallel arms 32a to 32c, and 42a to 42c is grounded.

FIG. 14 is an example of a chip that forms the duplexer 100, in which the low band side filter 3 and the high band side filter 4 composing the ladder-type filters are respectively formed on square-shaped piezoelectric substrates 11 and 12, and the piezoelectric substrates 11 and 12 and each of later-described piezoelectric substrates 10 are made of, for instance, $LiTaO_3$, $LiNbO_3$, crystalline quartz or the like. The reason why the filters 3 and 4 are formed on the separate piezoelectric substrates 11 and 12 as shown in FIG. 14 is as follows. In the duplexer, a high attenuation is required in the isolation characteristic 113 between the low band side filter port 5 and the high band side filter port 6. However, since a relative dielectric constant in the piezoelectric substrate is higher than that of air, if the high band side filter and the low band side filter are formed on the common piezoelectric substrate, an electrical coupling of each of elements between the filters may occur due to a stray capacitance inside the piezoelectric substrate. Accordingly, the high band side filter 4 and the low band side filter 3 are formed on the separate piezoelectric substrates and the influence on the isolation characteristic 113 is suppressed by reducing the influence of the stray capacitance, to thereby fulfill the requirement of the high attenuation.

If an upper side and a lower part in the drawing are respectively defined as a rearward side and a forward side, a low band side filter antenna port 2a composing the antenna port and the low band side filter port 5 are respectively formed on a rearward of the right side and a forward of the left side of the piezoelectric substrate 11, and are connected to the series arms 31a to 31c and the parallel arms 32a to 32c composing the low band side filter 3 via a connecting line 103 patterned on the piezoelectric substrate 11. The low band side filter antenna port 2a and a later-described filter antenna port 2b are electrically connected to each other via a conductive path provided in a package on which the piezoelectric substrates 11 and 12 are mounted, and form the antenna port 2. Further, 33a to 33c in the drawing denote ground ports for grounding the parallel arms 32a to 32c, and the ports are provided on the downstream sides of the respective parallel arms 32a to 32c. An input section of the transmission signal to the series arm 31a is connected to the low band side filter port 5, and through which the transmission signal from a not-shown transmission processing section is input into the low band side filter 3.

A high band side filter antenna port 2b and the high band side filter port 6 are respectively formed on the rearward side and the forward side of the piezoelectric substrate 12, and are coupled to the series arms 41a to 41c and the parallel arms 42a to 42c composing the high band side filter 4 by a connecting line 104 patterned on the piezoelectric substrate 12. Further, 43a to 43c in the drawing denote ground ports for grounding the parallel arms 42a to 42c, and the ports are provided on the downstream sides of the respective parallel arms 42a to 42c.

The reason why the filter antenna ports 2a and 2b are respectively disposed on the rearward side of the low band side filter port 5 and the high band side filter port 6 in the piezoelectric substrates 11 and 12 is to enlarge a distance between the ports in the piezoelectric substrates for preventing a short circuit between the filter antenna port 2a and the low band side filter port 5 and between the filter antenna port 2b and the high band side filter port 6, respectively. Further, the antenna port 2 in a later-described drawing is also disposed on the rearward side of the low band side filter port 5 and the high band side filter port 6 in the piezoelectric substrate 10 by the same reason.

The respective piezoelectric substrates 11 and 12 are mounted on the package in a layout shown in FIG. 14, namely, in a state of being arranged side to side so that the respective filter antenna ports 2a and 2b come close to each other and the distance between the filter ports 5 and 6 becomes large. This is because the improvement of characteristic of each filter can be realized by decreasing the distance between the filter antenna ports 2a and 2b while preventing the short circuit between the filter ports 5 and 6.

Each of the SAW resonators 31a to 31c, 32a and 32b, 41a to 41c, and 42a and 42b is formed of a piezoelectric substrate and an electrode part 7 formed by being patterned on the piezoelectric substrate, in which each of the electrode parts 7 includes a well-known IDT electrode 71 shown in FIG. 15(a) and reflectors 72 disposed on the left and right of the IDT electrode 71. Note that in the respective drawings such as FIG. 14 which will be described hereinbelow, the IDT electrode 71 and the reflectors 72 are illustrated in a simplified form as shown in FIG. 15(b). Further, for easier identification, in the respective drawings to be described hereinafter, an identification code "s" is appropriately attached to the series arms 31a to 31c and 41a to 41c, and an identification code "p" is appropriately attached to the parallel arms 32a to 32c and 42a to 42c.

Incidentally, in accordance with a further miniaturization of the cellular phone and the like in recent years, the duplexer of a smaller size has been also required, and thus there is a necessity to form two ladder-type filters into one chip, to thereby form them on one piezoelectric substrate, as shown in FIG. 16, for instance.

In this example, the piezoelectric substrate 10 is formed symmetrically, and in a region on the left side of the drawing, the series arms 31a to 31c, the parallel arms 32a to 32c, the respective ground ports 33a to 33c, and the low band side filter port 5 composing the low band side filter 3 are disposed in the same layout as that of the piezoelectric substrate 11. Further, in a region of the piezoelectric substrate 10 on the right side of the drawing, the series arms 41a to 41c, the parallel arms 42a to 42c, the respective ground ports 43a to 43c, and the high band side filter port 6 composing the high band side filter 4 are disposed in the same layout as that of the piezoelectric substrate 12.

Further, in each of regions on the left side and the right side of a center of the piezoelectric substrate 10 in the left and right directions thereof, conductive paths 105 are formed in substantially the same layout as that of the connecting lines 103 and 104 respectively formed on the piezoelectric substrates 11 and 12, the conductive paths 105 are joined at a center of the piezoelectric substrate 10 in the left and right directions thereof, and connected to the antenna port 2 by directing toward the rearward side of the piezoelectric substrate 10. The detailed layout of the series arms, the parallel arms and the respective ports is the same as that of a duplexer 1 according to an embodiment of the present invention, so that it will be described in the embodiment.

If the duplexer 100 is formed on one piezoelectric substrate 10 as described above, a coupling is occurred between the electrodes composing the SAW resonators in the respective low band side filter 3 and the high band side filter 4 and between the electrode of the SAW resonator in the high band side filter 4 and the electrode of the SAW resonator in the low band side filter 3 as shown by C1 to C15 in FIG. 18, for instance, due to the stray capacitance inside the piezoelectric substrate 10, and therefore, unnecessary paths are formed. As a result of this, the isolation characteristic 113 at the high band side is deteriorated, which is a problem. Note that even when the low band side filter 3 and the high band side filter 4 are formed on the respective two piezoelectric substrates 11 and 12, if the piezoelectric substrates 11 and 12 are reduced in sizes and a distance between the elements is reduced or a distance between the substrates is reduced, such coupling shown in FIG. 18 may occur, resulting that the isolation characteristic may deteriorate.

Patent Document 1 discloses a duplexer, in which a parallel arm SAW resonator that forms a low band side filter and is closest to a low band side filter port is connected to a parallel arm resonator at a high band side, so that the duplexer has a different configuration from that of the present invention. Further, in a duplexer disclosed in Patent Document 2, parallel arm SAW resonators are not connected to each other, so that the duplexer has a different configuration from that of the present invention. Besides, these Patent Documents make no reference to the aforementioned problem regarding the coupling, and thus it is not possible to solve the above-described problem in the inventions disclosed in these Patent Documents.

[Patent Document 1] Japanese Patent Application Laid-open No. 2002-368572 (FIG. 2)

[Patent Document 2] Japanese Patent Application Laid-open No. 2007-189501 (FIG. 4)

SUMMARY OF THE INVENTION

The present invention is made based on such circumstances, and an object thereof is to provide a duplexer which is small in size and excellent in separation characteristic of transmission/reception signals.

A duplexer of the present invention having a low band side filter provided between a first signal port and an antenna port and formed of a ladder-type filter including elastic wave resonators that form series arms and elastic wave resonators that form parallel arms, and a high band side filter having a pass band higher than that of the low band side filter, provided between a second signal port and the antenna port, and formed of a ladder-type filter including elastic wave resonators that form series arms and elastic wave resonators that form parallel arms, the filters being provided on a piezoelectric substrate, the duplexer is characterized in that it disposes the antenna port on a center of a rearward side in a disposition area of the duplexer, disposes the high band side filter and the low band side filter on either of a left side and a right side of the antenna port and on the other side thereof, respectively, provides the parallel arm at a last stage in the low band side filter, the parallel arm at a last stage in the high band side filter, the first signal port and the second signal port seen from the antenna port at positions on the forward side of the antenna port, mutually connects a ground side of the parallel arm on a front stage side of the parallel arm at the last stage in the low band side filter and a ground side of the parallel arm on a front stage side of the parallel arm at the last stage in the high band side filter via a conductive path formed on the piezoelectric substrate at a rearward side of the antenna port, and provides the parallel arms connected by the conductive path at positions on the rearward side of the parallel arms at the last stages.

Further, a duplexer of the present invention having a low band side filter provided between a first signal port and an antenna port and formed of a ladder-type filter including resonant elements that form series arms and resonant elements that form parallel arms, and a high band side filter having a pass band higher than that of the low band side filter, provided between a second signal port and the antenna port, and formed of a ladder-type filter including resonant elements that form series arms and resonant elements that form parallel arms, the filters being provided on a piezoelectric substrate, in which the series arm in the low band side filter closest to the first signal port or the series arm in the high band side filter closest to the second signal port seen from the antenna port is a longitudinal mode resonant filter and the other resonant elements are elastic wave resonators, the duplexer is characterized in that it disposes the antenna port on a center of a rearward side in a disposition area of the duplexer, disposes the high band side filter and the low band side filter on either of a left side and a right side of the antenna port and on the other side thereof, respectively, provides the longitudinal mode resonant filter, the parallel arm at a last stage in the low band side filter or the high band side filter in which the longitudinal mode resonant filter is not provided, the first signal port and the second signal port seen from the antenna port at positions on the forward side of the antenna port, mutually connects a ground side of the parallel arm on a front stage side of the longitudinal mode resonant filter in the low band side filter or the high band side filter in which the longitudinal mode resonant filter is provided and a ground side of the parallel arm on a front stage side of the parallel arm at the last stage in the low band side filter or the high band side filter in which the longitudinal mode resonant filter is not provided via a conductive path formed on the piezoelectric substrate at a rearward side of the antenna port, and provides the parallel arms connected by the conductive path at positions on the rearward side of the parallel arm at the last stage in the low band side filter or the high band side filter in which the longitudinal mode resonant filter is not provided and the longitudinal mode resonant filter.

Furthermore, a duplexer of the present invention having a low band side filter provided between a first signal port and an antenna port and formed of a ladder-type filter including resonant elements that form series arms and resonant elements that form parallel arms, and a high band side filter having a pass band higher than that of the low band side filter, provided between a second signal port and the antenna port, and formed of a ladder-type filter including resonant elements that form series arms and resonant elements that form parallel arms, the filters being provided on a piezoelectric substrate, in which the series arm in the low band side filter closest to the first signal port and the series arm in the high band side filter closest to the second signal port seen from the antenna port are longitudinal mode resonant filters and the other resonant elements are elastic wave resonators, the duplexer is characterized in that it disposes the antenna port on a center of a rearward side in a disposition area of the duplexer, disposes the high band side filter and the low band side filter on either of a left side and a right side of the antenna port and on the other side thereof, respectively, provides each of the longitudinal mode resonant filters, the first signal port and the second signal port seen from the antenna port at positions on the forward side of the antenna port, mutually connects a ground side of the parallel arm on a front stage side of the longitudinal mode resonant filter in the low band side filter and a ground side of the parallel arm on a front stage side of the longitudinal mode resonant filter in the high band side filter via a conductive path formed on the piezoelectric substrate at a rearward side of the antenna port, and provides the parallel arms connected by the conductive path at positions on the rearward side of the longitudinal mode resonant filters.

It is also possible that the conductive path is not provided on the piezoelectric substrate but on a supporting member that supports the piezoelectric substrate, and a projection area of the conductive path to the piezoelectric substrate may be positioned on the rearward side of the antenna port. Further, it is also possible that the piezoelectric substrate is formed of a first piezoelectric substrate on which the low band side filter and the first signal port are formed and supported by the supporting member, and a second piezoelectric substrate on which the high band side filter and the second signal port are formed and disposed together with the first piezoelectric substrate in a lateral direction of the first substrate via the supporting member, in which each of the first piezoelectric substrate and the second piezoelectric substrate is provided with a conductive member that forms the conductive path via a supporting conductive path provided in the supporting member when it is supported by the supporting member, and a projection area of the supporting conductive path to the first piezoelectric substrate and the second piezoelectric substrate may be positioned on the rearward side of the antenna port.

It is also possible that the conductive path mutually connects ground ports which are respectively disposed on the left and right of the piezoelectric substrate seen from the antenna port to ground the parallel arms.

As shown by a later-described evaluation test, by mutually connecting the ground side of the parallel arm at a front stage of the last stage provided in the low band side filter and that provided in the high band side filter seen from the antenna port via the conductive path, and disposing, if a side on which the first and second signal ports are disposed seen from the antenna port is defined as a forward side, the conductive path on a rearward side of the antenna port, it is possible to obtain a duplexer which is small in size and excellent in separation characteristic of transmission/reception signals.

Further, even when the series arms closest to the signal ports are the longitudinal mode resonant filters, by connecting between the high band side filter and the low band side filter via the conductive path using the ground sides of the parallel arms at front sides of the longitudinal mode resonant coupling type filters and disposing the conductive path as described above, it is possible to similarly obtain a duplexer which is small in size and excellent in separation characteristic of transmission/reception signals.

DETAILED DESCRIPTION OF THE PREFERRED EMBODIMENT(S)

Hereinafter, a configuration of a duplexer 1 according to the present embodiment will be described with reference to a plan view shown in FIG. 1. Similar to the aforementioned duplexer 100, the duplexer 1 is formed of a low band side filter 3 composed of a ladder-type filter in which SAW resonators are connected in six stages, and a high band side filter 4 similarly composed of a ladder-type filter. Further, a connection order of the SAW resonators composing the respective filters in the duplexer 1 is the same as that in the configuration of the low band side filter 3 and the high band side filter 4 in the duplexer 100 that has been already described above, so that an explanation thereof will be omitted.

Figure 1:
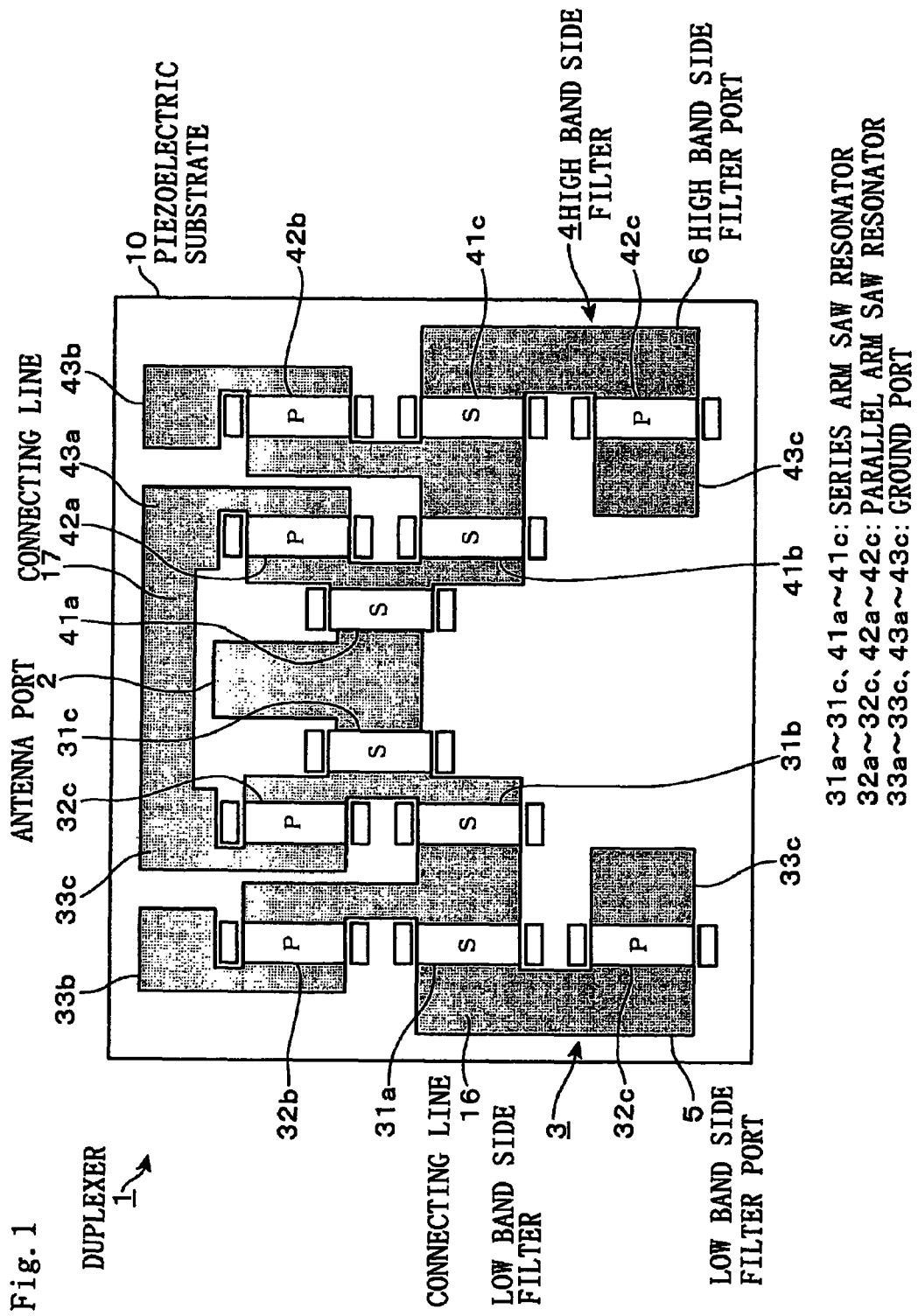
FIG. 1 is a plan view showing a configuration example of a duplexer according to an embodiment.

In the duplexer 1 of FIG. 1, the filters 3 and 4 are formed by being provided on a common square-shaped piezoelectric substrate 10, and an antenna port 2 is formed on a center portion of the piezoelectric substrate 10 in the left and right directions thereof and toward a rearward side of the substrate. Further, the low band side filter 3 and the high band side filter 4 are formed on regions on the left side and on the right side of the piezoelectric substrate 10, respectively.

The left half of the region of the piezoelectric substrate 10 in which the low band side filter 3 is formed will be described. On a corner portion of the forward left side of the piezoelectric substrate 10, a low band side filter port 5 being a first signal port is formed, and on the forward side of the antenna port 2 and on the rearward side of the low band side filter port 5, series arms 31a, 31b and 31c are arranged in this order from the left side toward the right side. Further, parallel arms 32a and 32b are arranged on the forward side and on the rearward side of the series arm 31a, respectively, and a parallel arm 32c is arranged on the rearward side of the series arm 31b. The series arms 31a to 31c and the parallel arms 32a to 32c are coupled by a connecting line 16 that forms a conductive path formed by being patterned on the piezoelectric substrate 10 in the same manner as described above, to thereby form the ladder-type filter. Further, ground ports 33a to 33c are formed on the right side of the parallel arm 32a, on the rearward side of the parallel arm 32b, and on the rearward side of the parallel arm 32c, respectively, and connected to the parallel arms 32a to 32c, respectively, via the connecting line 16. The parallel arms 32a to 32c are grounded via the ground ports 33a to 33c, respectively.

The right half of the region of the piezoelectric substrate 10 in which the high band side filter 4 is formed will be described. On a corner portion of the forward right side of the piezoelectric substrate 10, a high band side filter port 6 being a second signal port is formed, and on the forward side of the antenna port 2 and on the rearward side of the high band side filter port 6 in the right half of the region of the piezoelectric substrate 10, series arms 41a, 41b and 41c are arranged in this order from the left side toward the right side. Further, parallel arms 42c and 42b are arranged on the forward side and on the rearward side of the series arm 41c, respectively, and a parallel arm 42a is arranged on the rearward side of the series arm 41b. The series arms 41a to 41c and the parallel arms 42a to 42c are coupled by the connecting line 16 in the same manner as described above, to thereby form the ladder-type filter. Further, ground ports 43a to 43c are formed on the rearward side of the parallel arm 42a, on the rearward side of the parallel arm 42b, and on the left side of the parallel arm 42c, respectively, and connected to the parallel arms 42a to 42c, respectively, via the connecting line 16. The parallel arms 42a to 42c are grounded via the ground ports 43a to 43c, respectively.

The ground port 33c and the ground port 43a are electrically connected via a connecting line 17 patterned on the piezoelectric substrate 10 similarly as the connecting line 16, and the connecting line 17 is formed on the piezoelectric substrate 10 at its shortest length on the rearward side of the antenna port 2, namely, on the opposite side with respect to the direction in which the filter ports 5 and 6 are formed seen from the antenna port 2.

Figure 2:
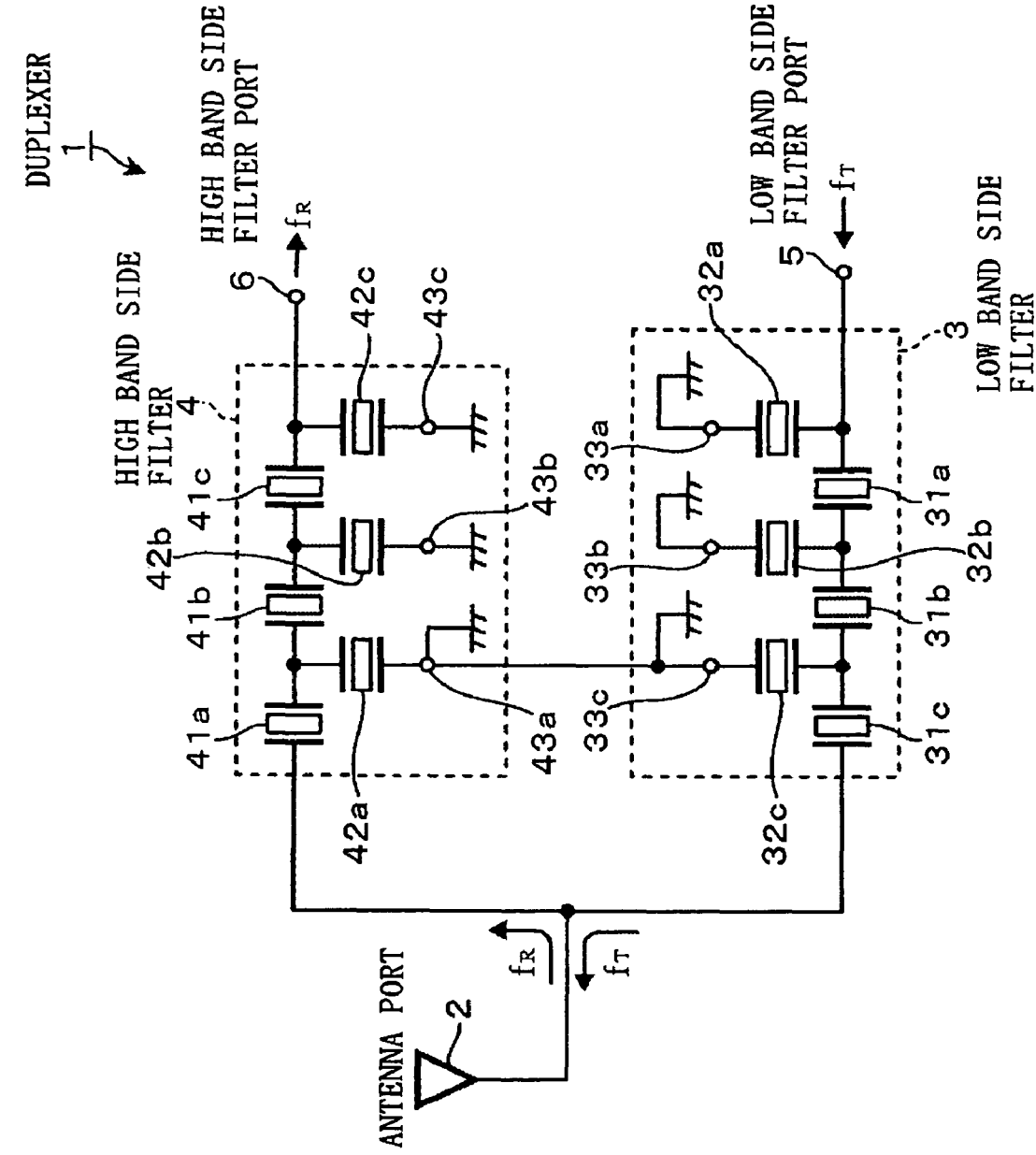
FIG. 2 is a circuit diagram of the duplexer.

FIG. 2 is a circuit diagram of the duplexer 1 shown in FIG. 1. As shown in FIG. 2, the aforementioned high band side filter 4 is formed as a T-type six-stage ladder-type filter in which the high band side filter port side is arranged in a π-type configuration (terminated at π side), and is provided with a function to select a frequency of a reception signal input from the antenna port 2. Here, if a principle in which the high band side filter 4 selects the frequency of the reception signal is briefly described, the respective parallel arms 42a to 42c in the high band side filter 4 are set to have an interval "d1" between respective electrode fingers 73 shown in FIG. 15(a) so that an impedance with respect to a signal whose frequency is lower than that in the high band side frequency pass band 115 illustrated in the drawing is minimized and an impedance with respect to a signal having a center frequency of the high band side frequency pass band 115 is maximized.

Figure 15:
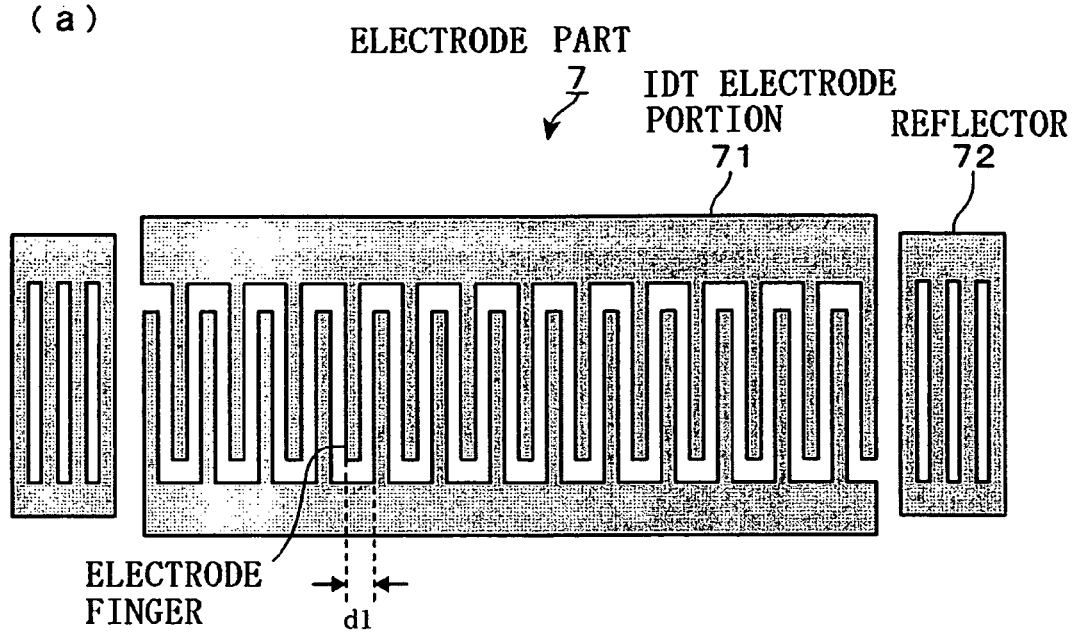
FIGS. 15(a) and 15(b) are plan views showing a shape of an IDT electrode of a resonator mounted on the duplexer.
Figure 15:
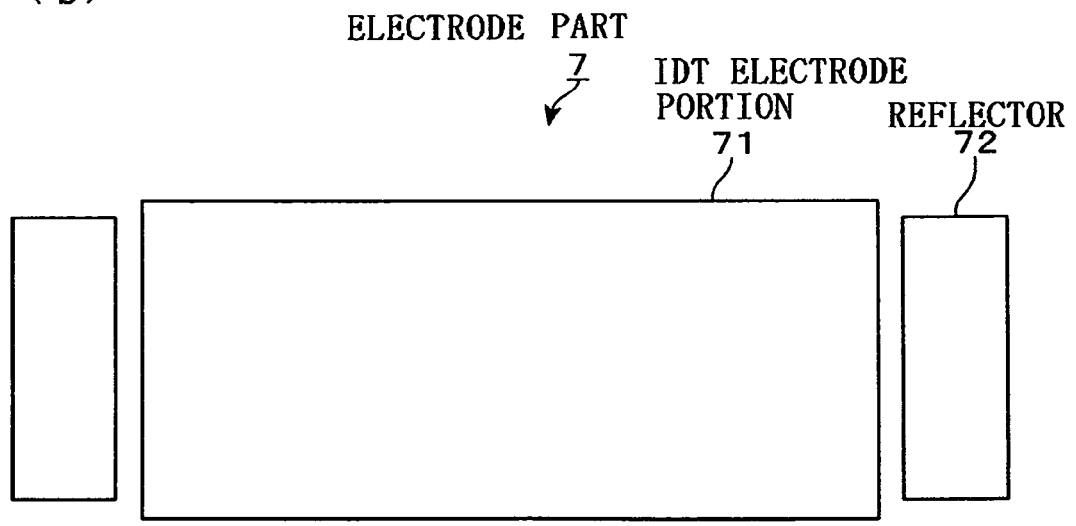

Meanwhile, the respective series arms 41a to 41c in the high band side filter 4 are set to have an interval "d1" between the respective electrode fingers 73 shown in FIG. 15(a) so that an impedance with respect to a signal having the center frequency of the high band side frequency pass band 115 is minimized and an impedance with respect to a signal whose frequency is higher than that in the high band side frequency pass band 115 is maximized. If a reception signal having a frequency at which the impedance of the parallel arms 42a to 42c is minimized is applied to the series arms 41a to 41c and the parallel arms 42a to 42c set as above and connected in a ladder type as described above, the respective parallel arms 42a to 42c become in a state of being short-circuited to the ground ports 43a to 43c with respect to the reception signal, so that the reception signal does not reach the high band side filter port 6.

Figure 17:
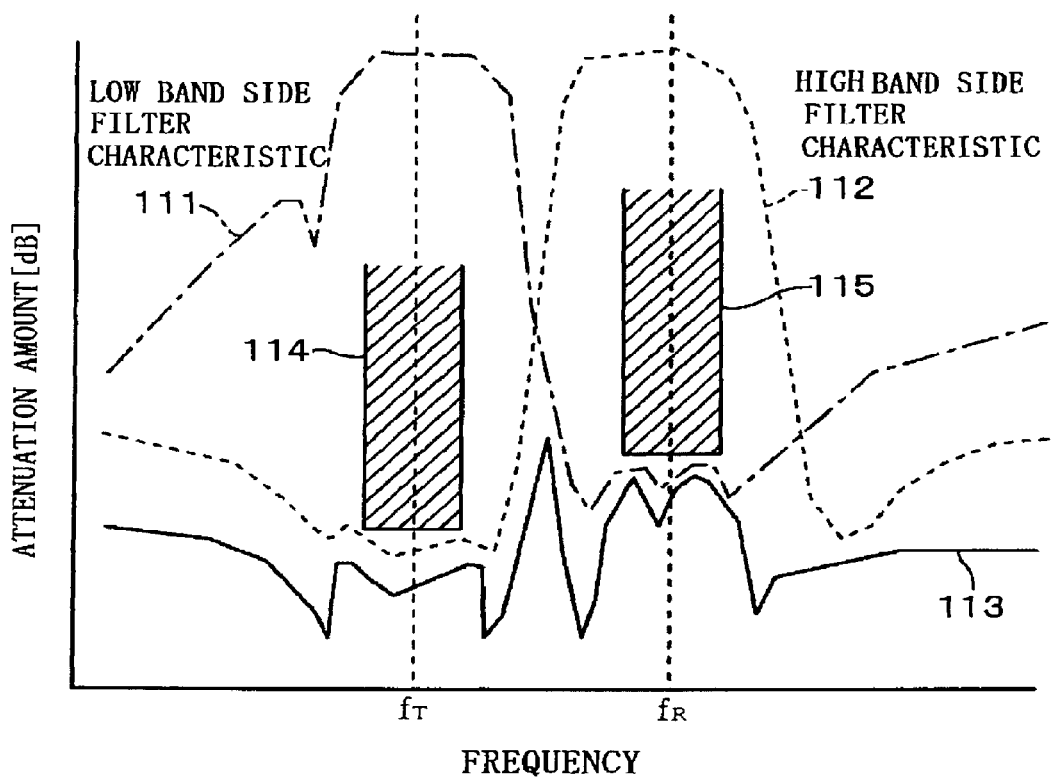
FIG. 17 is a characteristic diagram showing a frequency characteristic of the duplexer.
Figure 18:
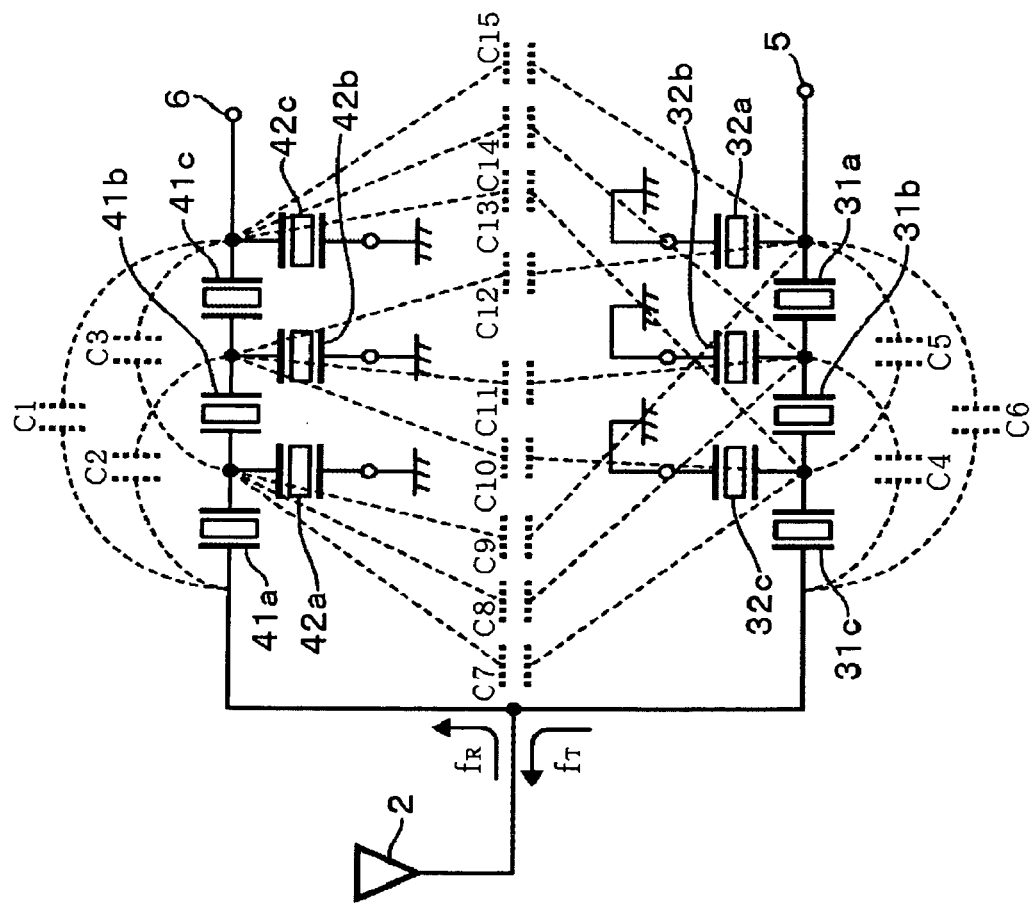
FIG. 18 is an explanatory diagram showing a coupling that occurs in the conventional duplexer.

If a frequency of the reception signal is increased from this state, although the impedance of the parallel arms 42a to 42c with respect to the reception signal becomes high, the impedance of the series arms 41a to 41c is lowered, so that the series arm 41a at the first stage to the series arm 41c at the third stage are conducted, resulting the reception signal reaches the high band side filter port 6. Subsequently, if the frequency of the reception signal is further increased, the impedance of the series arms 41a to 41c becomes high, resulting that the reception signal does not flow into the series arms 41a to 41c from the antenna port 2. With the use of such a function of the high band side filter 4, the high band side filter characteristic 112 in which the reception signal having a frequency in the high band side frequency pass band 115 passes through the high band side filter port 6 from the antenna port 2 and the signal having a frequency which is not included in the high band side frequency pass band 115 does not reach the high band side filter 6 as shown in FIG. 17, is realized.

Further, also in the low band side filter 3, an interval "d1" between electrode fingers 73 in the respective series arms 31a to 31c and the parallel arms 32a to 32c is set so that the low band side filter characteristic 111 in which a transmission signal having a frequency in the low band side frequency pass band 114 passes through the antenna port 2 from the low band side filter port 5 and a signal having a frequency which is not included in the low band side frequency pass band 114 does not reach the antenna port 2, is realized by the same principle as that of the aforementioned high band side filter 4.

In order to achieve a high isolation characteristic between the high band side filter 4 and the low band side filter 3, a suppression of electrical coupling between these filters has been considered to be effective. Accordingly, it has been considered such that a higher isolation characteristic is achieved when the ground port connected to the parallel arm in the high band side filter 4 and the ground port connected to the parallel arm in the low band side filter 3 are not connected to each other. However, as shown by a later-described result of the evaluation test, the inventor has clarified that a better isolation characteristic is actually obtained by connecting between the ground ports so as to connect the rear stage side of the predetermined parallel arm in the high band side filter 4 and the rear stage side of the predetermined parallel arm in the low band side filter 3 to mutually connect the low band side filter 3 and the high band side filter 4 as in the duplexer 1 in FIG. 1, compared to a case of not connecting between the ground ports.

However, if the connecting line that connects between the ground ports is provided on the forward side of the piezoelectric substrate, the isolation characteristic is not sufficiently improved, which has been confirmed by the inventor. This is considered because the distance among the connecting line, the high band side filter port 6 and the low band side filter port 5 becomes short and the electrical coupling occurs among the connecting line and the filter ports 5 and 6, which results in deterioration of the isolation characteristic.

If the duplexer 1 is thus configured as shown in FIG. 1 and FIG. 2, the improvement of isolation characteristic can be realized. This is effective since the duplexer can be miniaturized according thereto.

Incidentally, the configuration of the duplexer is not limited to the one shown in FIG. 1, and by mutually connecting, in the respective low band side filter and the high band side filter, the ground sides of the parallel arms on the front stage sides of the parallel arms provided at the last stages seen from the antenna port side toward the respective filter ports, the isolation characteristic is improved similarly as in the duplexer in FIG. 1, which has been confirmed by the inventor.

Specifically, in the duplexer 1, it is possible to improve the isolation characteristic by mutually connecting either of the ground ports 33c and 33b and either of the ground ports 43a and 43b, instead of connecting between the ground ports 33c and 43a, to thereby connect between the filters 3 and 4.

Figure 3:
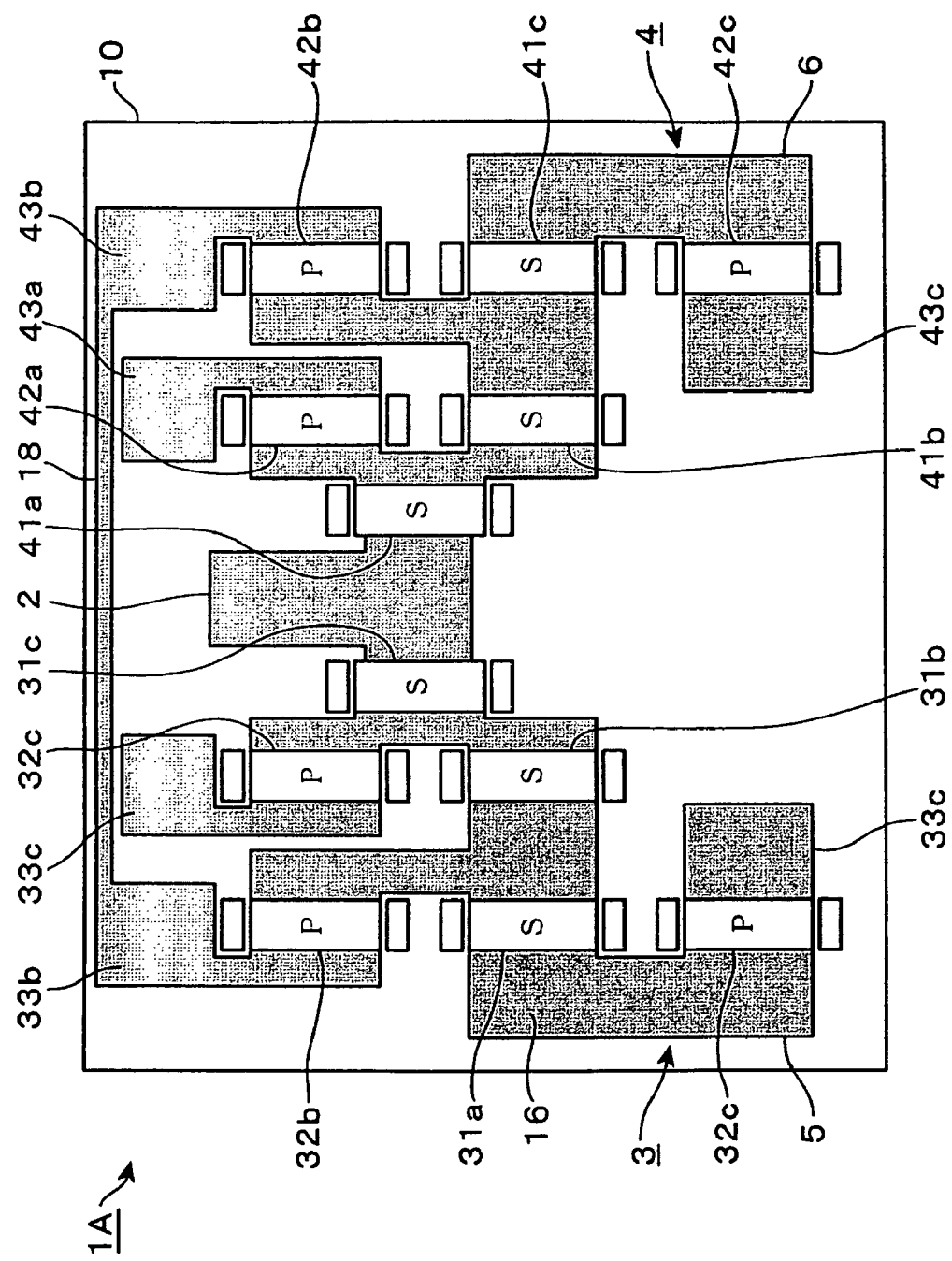
FIG. 3 is a plan view showing a first modified example of the duplexer.
Figure 4:
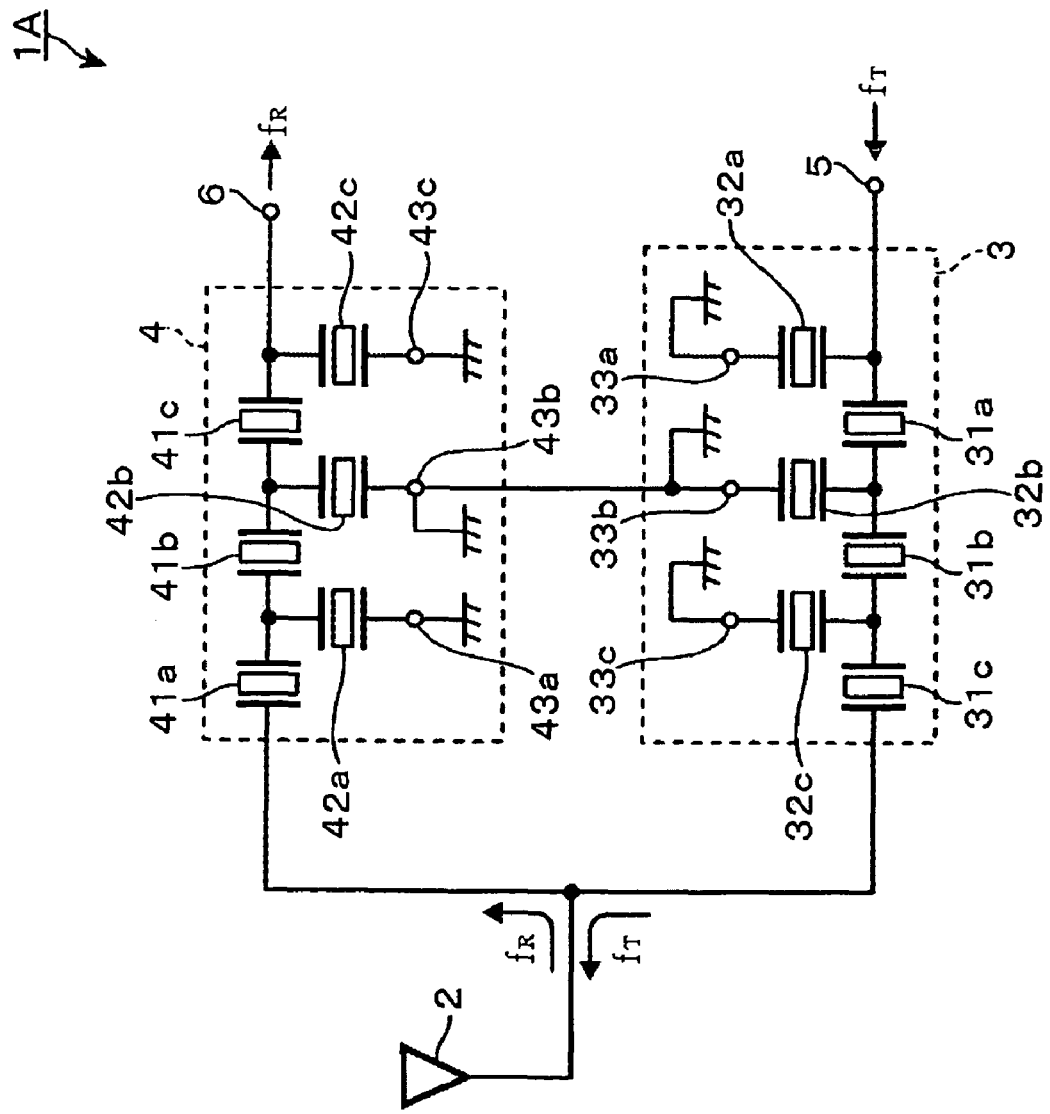
FIG. 4 is a circuit diagram of the first modified example.

A modified example of the duplexer 1 in which the connection of the ground ports is changed as described above will be explained. In a duplexer 1A shown in FIG. 3, between the ground ports 33b and 43b is connected via a connecting line 18 patterned on the piezoelectric substrate 10 similarly as the connecting line 17, instead of connecting between the ground ports 33c and 43a via the connecting line 17, and the connecting line 18 is disposed on the rearward side of the antenna port 2. FIG. 4 is a circuit diagram of the duplexer 1A. It is possible to improve the isolation characteristic at the high band side also in the duplexer 1A shown in these drawings, similarly as in the duplexer 1.

Figure 5:
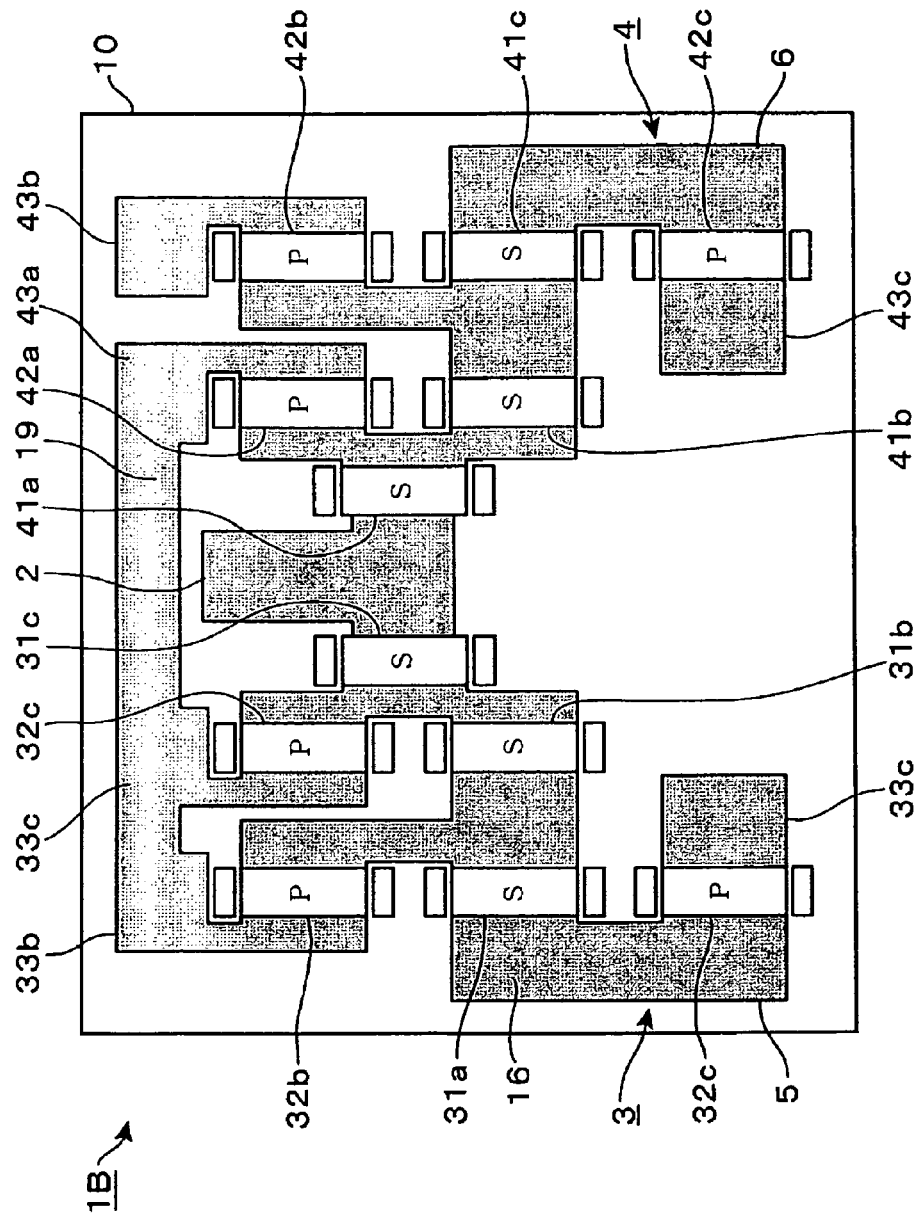
FIG. 5 is a plan view showing a second modified example of the duplexer.
Figure 6:
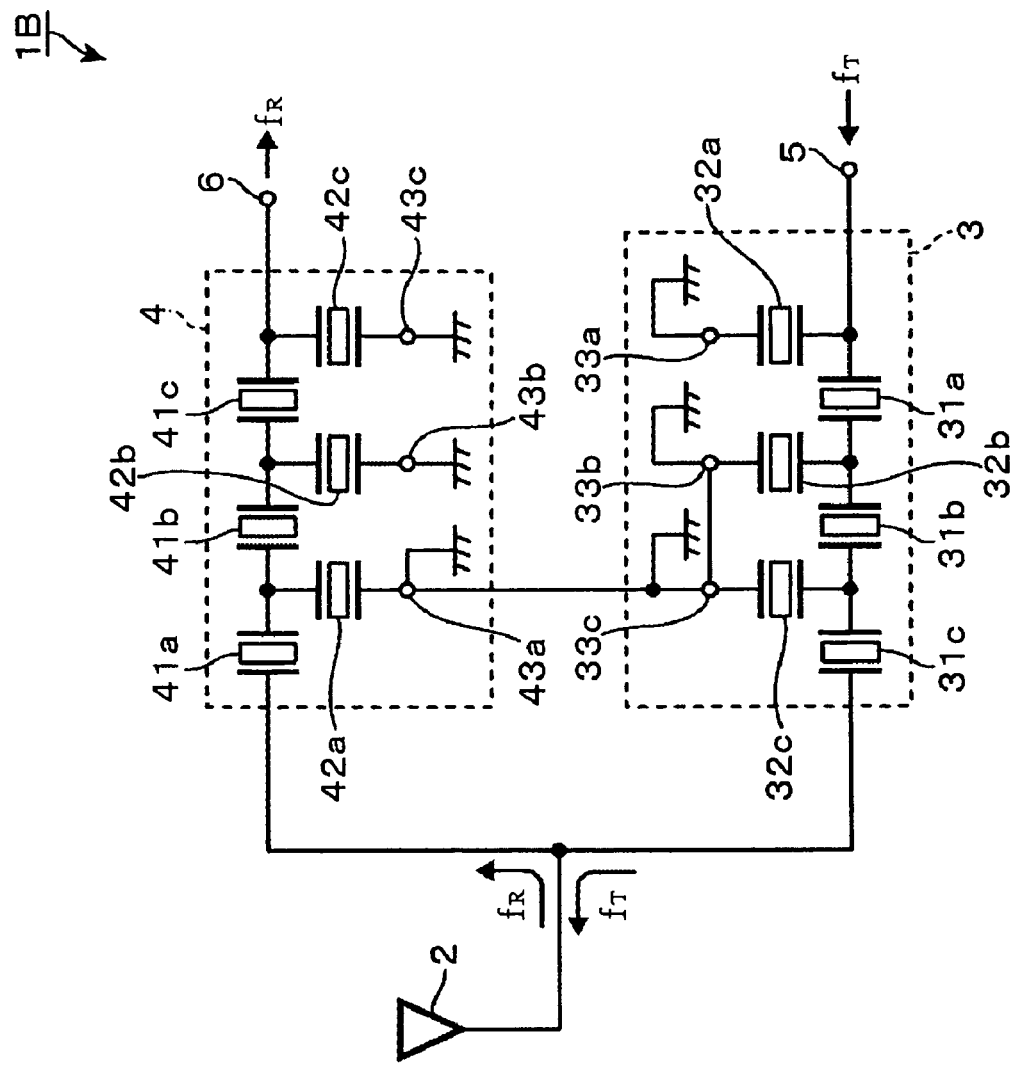
FIG. 6 is a circuit diagram of the second modified example.

FIG. 5 shows a surface of the piezoelectric substrate 10 that forms a duplexer 1B being another modified example of the duplexer 1, and FIG. 6 shows a circuit diagram of the duplexer 1B. In the duplexer 1B, the ground ports 33b, 33c and 43a are mutually connected by a connecting line 19. The connecting line 19 is linearly formed on the piezoelectric substrate 10 so that the connecting line 17 is extended further toward the ground port 33b from the ground port 33c. It is possible to improve the isolation characteristic at the high band side also in the duplexer 1B, similarly as in the duplexer 1. As above, it is possible to connect between the ground ports 33b and 33c in the low band side filter 3, and it is also possible to connect between the ground ports 43a and 43b in the high band side filter 4.

Figure 7:
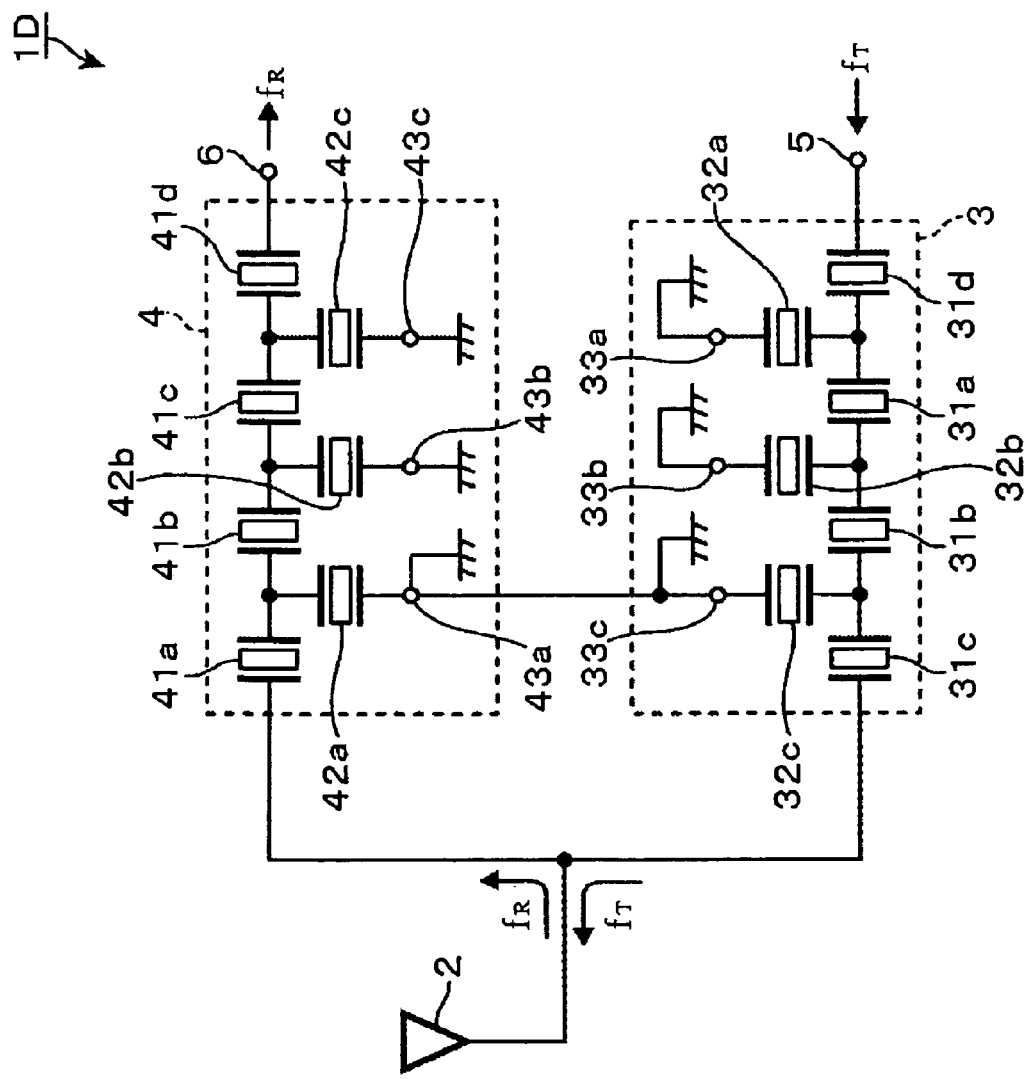
FIG. 7 is a circuit diagram of a third modified example of the duplexer.

Further, in each of the filters 3 and 4, the number of connection stages of the SAW resonators is not limited to six stages. For instance, FIG. 7 shows a circuit diagram of a duplexer 1D being still another modified example of the duplexer 1. A series arm 31d is connected on the low band side filter port 5 side of the series arm 31a in the low band side filter 3 of the duplexer 1D, and the parallel arm 32a is connected between the series arms 31a and 31d. Further, a series arm 41d is connected on the high band side filter port 6 side of the series arm 41c in the high band side filter 4 of the duplexer ID, and the parallel arm 42c is connected between the series arms 41c and 41d. Specifically, each side of the filter ports 5 and 6 of the respective filters 3 and 4 is arranged in a T-type configuration.

In an example of FIG. 7, the rear stage sides of the parallel arms 42a and 32c are mutually connected via the ground ports 43a and 33c similarly as in the duplexer 1, and also in such a case in which the number of connection stages is not six stages, by mutually connecting the rear stage sides of the parallel arms at front stages of the last stages seen from the antenna port 2, namely, by connecting either of the ground ports 33b and 33c and either of the ground ports 43a and 43b in this example, it is possible to improve the isolation characteristic. Note that although an illustration of a layout of the piezoelectric substrate 10 of the duplexer ID is omitted, a connecting line connecting the ground ports 43a and 33c passes on the rearward side of the antenna port 2, similarly as in FIG. 1.

Figure 8:
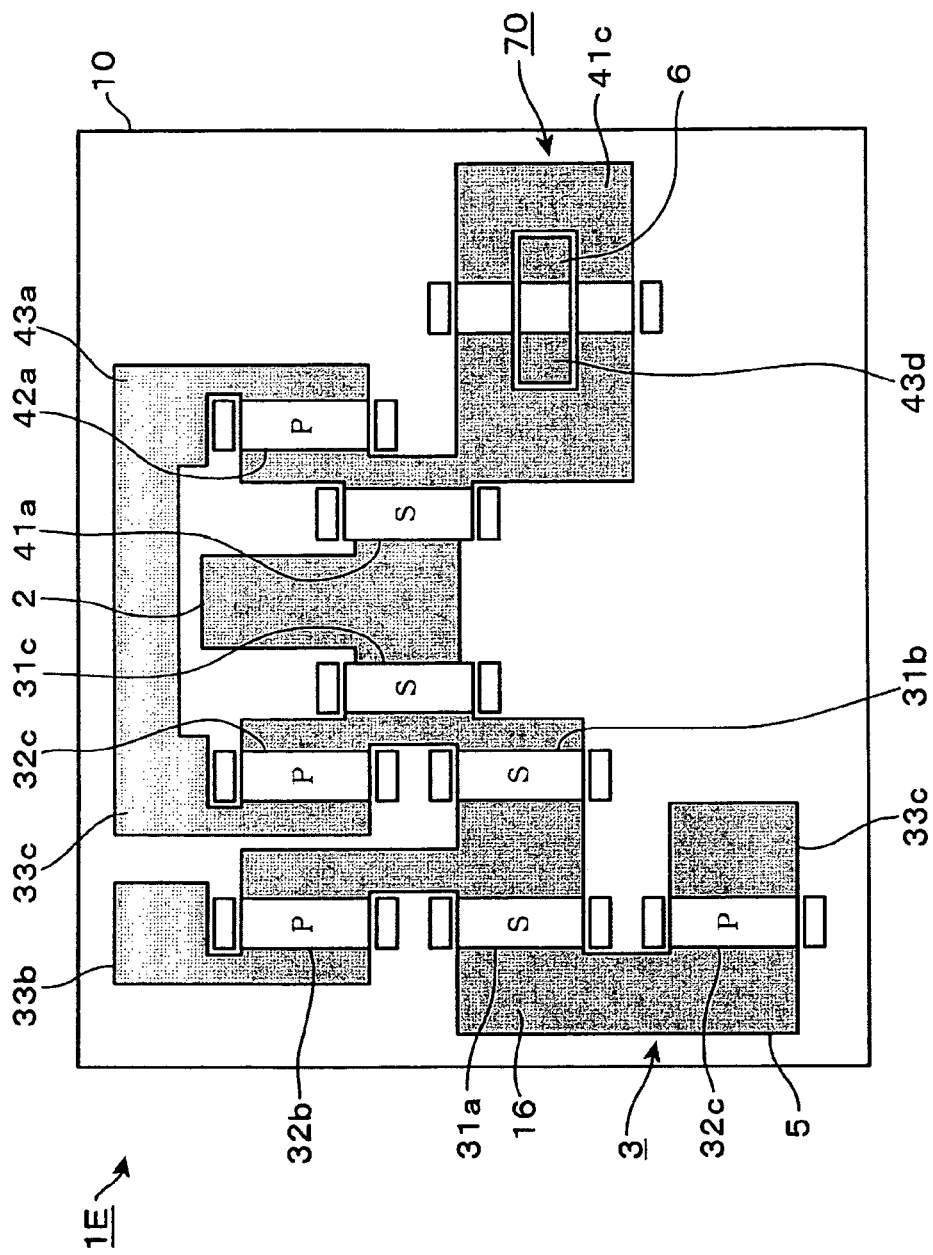
FIG. 8 is a plan view showing a fourth modified example of the duplexer.
Figure 9:
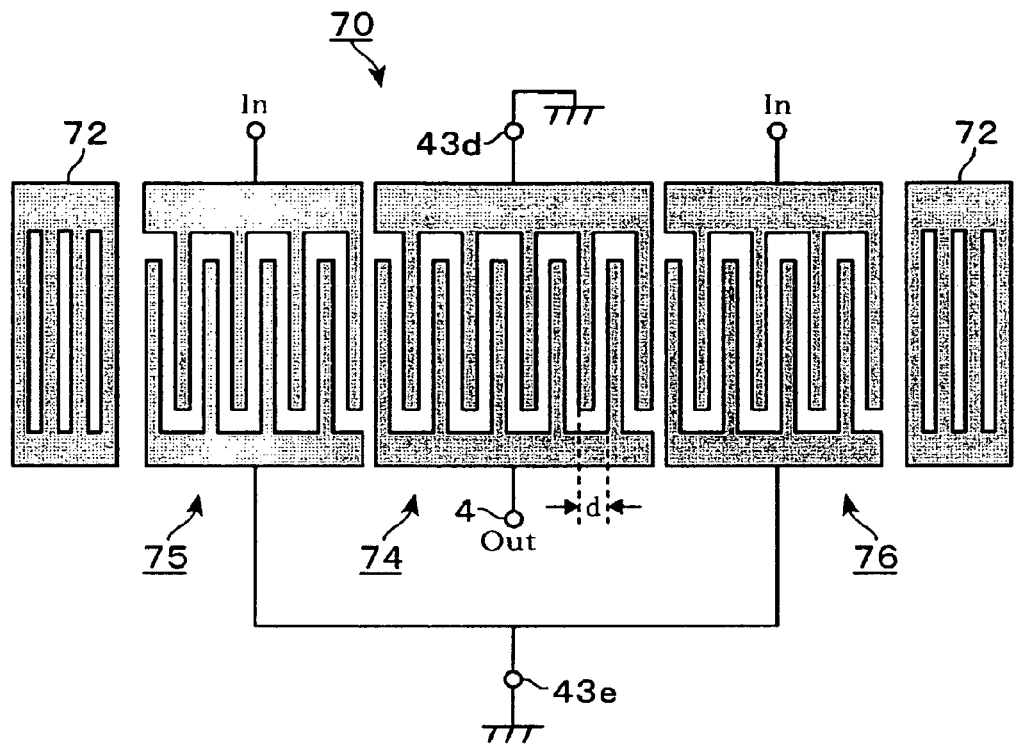
FIGS. 9(a) and 9(b) are configuration diagrams of a longitudinal mode resonant filter included in the duplexer being the third modified example.
Figure 9:
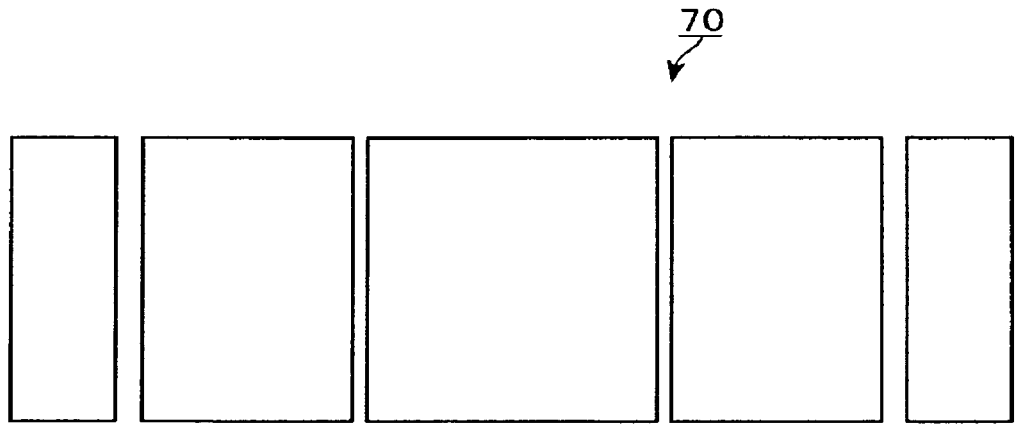

Although an example in which only the elastic wave resonators are included as the resonant elements composing the respective filters has been described so far, an example in which a longitudinal mode resonant filter is further included as the resonant element will be described. FIG. 8 shows a surface of a duplexer 1E that includes the longitudinal mode resonant filter. A different point between the duplexer 1E and the duplexer 1 is that the high band side filter 4 of the duplexer 1E includes a longitudinal mode resonant filter 70 formed of an electrode part patterned on the piezoelectric substrate 10. FIG. 9(a) shows a configuration of the longitudinal mode resonant filter 70, and the longitudinal mode resonant filter 70 is provided with an IDT electrode portion 74, IDT electrode portions 75 and 76 provided on both left and right sides of the IDT electrode portion 74, and reflectors 72 provided on both left and right sides of the IDT electrode portions 75 and 76. Also in the longitudinal mode resonant filter 70, an interval d between electrode fingers of the respective electrode portions 74 to 76 is set in accordance with a desired filter characteristic. In FIG. 8, the respective electrode portions and the reflectors of the longitudinal mode resonant filter 70 are illustrated in a simplified form as shown in FIG. 9(b).

The respective electrodes to be paired with each other composing the IDT electrode portion 74 are respectively connected to a ground port 43d and the high band side filter port 6 formed on the piezoelectric substrate 10. Further, one of the electrodes to be paired with each other composing each of the IDT electrode portions 75 and 76 is connected to a ground port 43e, and the other electrode is connected to the series arm 41a via the connecting line 16. As above, the longitudinal mode resonant filter 70 is formed as a series arm closest to the filter port 6 in the high band side filter 4. Further, the parallel arm 42a is connected between the series arm 41a and the longitudinal mode resonant filter 70, and the ground port 43a connected to the parallel arm 42a and the ground port 33c of the low band side filter 3 are connected by the connecting line 17, similarly as in the duplexer 1 in FIG. 1.

Also in the duplexer 1E, it is possible to improve the isolation characteristic 113 at the high band side, similarly as in the duplexer 1 of the first embodiment. Incidentally, if the low band side filter is formed only of the elastic wave resonators while the high band side filter includes the longitudinal mode resonant filter formed as the series arm provided to be closest to the filter port as described above, by mutually connecting a ground side of either of the parallel arms at the front side of the longitudinal mode resonant filter in the high band side filter and a ground side of the parallel arm provided at the front stage of the parallel arm positioned closest to the low band side filter port in the low band side filter, it is possible to improve the isolation characteristic 113. Specifically, in the duplexer 1E, it is possible to connect the ground port 43a and the ground port 33b, instead of connecting the ground port 43a and the ground port 33c.

Further, if a configuration opposite to that of the duplexer 1E is applied, namely, if the high band side filter is formed only of the elastic wave resonators while the low band side filter includes the longitudinal mode resonant filter formed as the series arm provided to be closest to the filter port, by mutually connecting a ground side of either of the parallel arms at the front side of the longitudinal mode resonant filter in the low band side filter and a ground side of the parallel arm provided at the front stage of the parallel arm positioned closest to the filter port in the high band side filter, it is possible to improve the isolation characteristic 113. Further, if each of the low band side filter and the high band side filter includes the longitudinal mode resonant filter formed as the series arm provided to be closest to the filter port, by mutually connecting ground sides of the parallel arms at the front sides of the respective resonant filters in the respective low band side filter and the high band side filter, it is possible to realize the improvement of the isolation characteristic.

Figure 10:
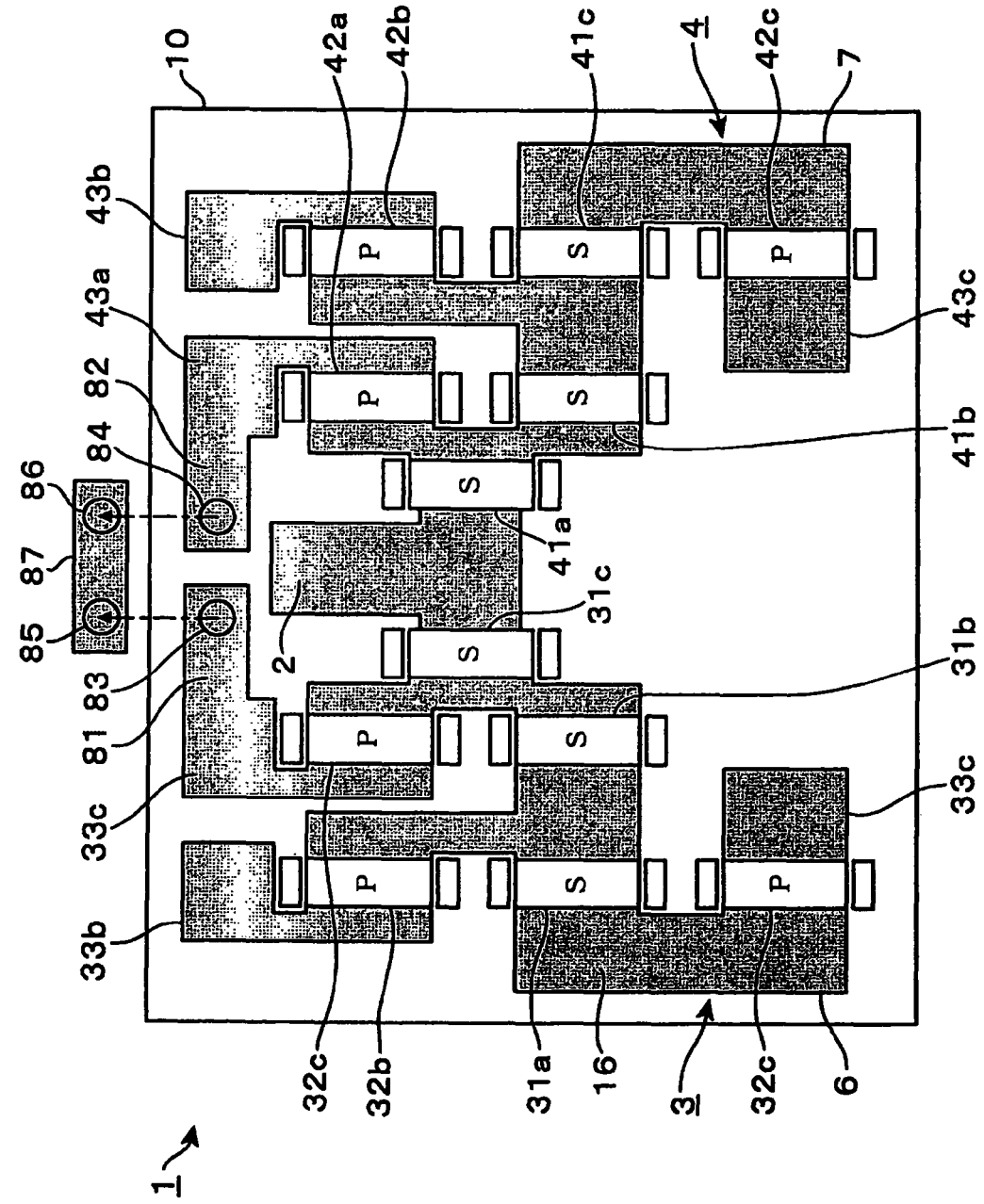
FIG. 10 is a plan view showing a fifth modified example of the duplexer.

Incidentally, the ground ports do not always have to be connected to each other by the connecting line patterned on the piezoelectric substrate, and, for instance, they may be connected by attaching a conducting member such as an aluminum plate and a wire to the piezoelectric substrate, in which a material and a connecting method for conducting the electrical connection are not particularly limited. For instance, in the duplexer 1 shown in FIG. 10, connecting lines 81 and 82 on the piezoelectric substrate 10 extend from the ground port 33c and the ground port 43a toward a center of the piezoelectric substrate in the left and right directions thereof, and conductive bumps 83 and 84 are formed on end portions of the connecting lines.

When the piezoelectric substrate 10 is mounted on a package being a supporting member that supports a rear surface of the piezoelectric substrate 10, the bumps 83 and 84 are respectively connected to conductive bumps 85 and 86 provided in the package. The bumps 85 and 86 are electrically connected to each other via a conductive path 87 formed by being patterned on the package, and it may be configured such that the ground port 33c and the ground port 43a are electrically connected via the respective bumps 83 to 86, the conductive path 87 and the connecting lines 81 and 82, by mutually connecting the bumps as described above. A projection area of the conductive path 87 to the piezoelectric substrate 10 is positioned on extensions of the connecting lines 81 and 82, namely, on the rearward side of the antenna port 2 when the piezoelectric substrate 10 is supported by being mounted on the package.

Figure 11:
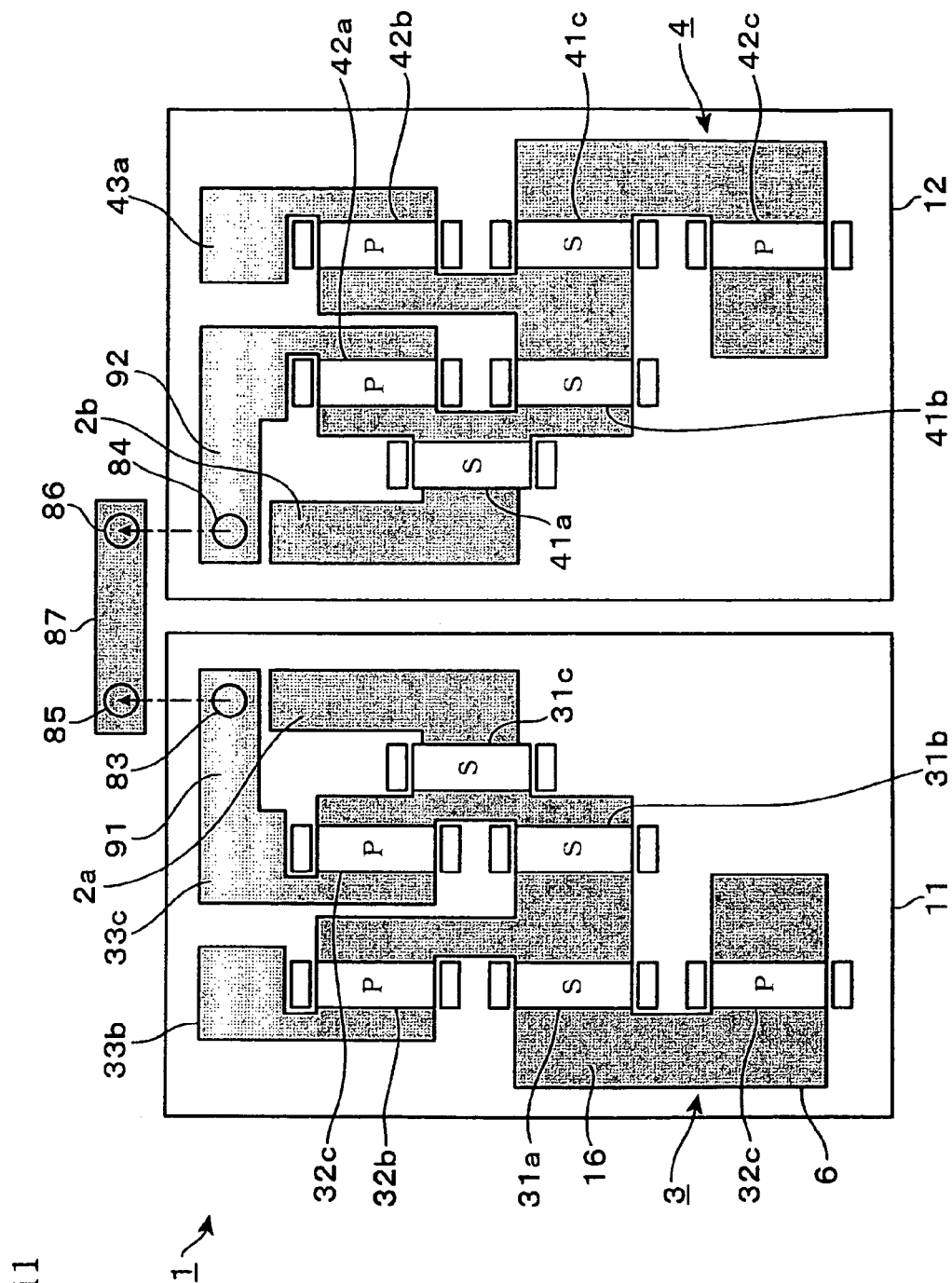
FIG. 11 is a plan view showing a sixth modified example of the duplexer.

Further, the low band side filter 3 and the high band side filter 4 do not always have to be formed on one piezoelectric substrate as described above, namely, formed in one-chip configuration, and they may be formed on separate piezoelectric substrates, namely, formed in two-chip configuration. FIG. 11 shows an example of the duplexer 1 which is formed in the two-chip configuration, in which the piezoelectric substrates 11 and 12 are mounted on the aforementioned package in a layout shown in FIG. 11. The configurations of the piezoelectric substrates 11 and 12 on which the low band side filter 3 and the high band side filter 4 are respectively mounted are respectively substantially the same as those of the piezoelectric substrates 101 and 102 mentioned in the section of the description of the related art, so that different points of the configurations will be mainly described. In the piezoelectric substrate 11, a connecting line 91 that passes from the ground port 33c to the rearward side of the filter antenna port 2a and directs toward the piezoelectric substrate 12 side is formed, and in the piezoelectric substrate 12, a connecting line 92 that passes from the ground port 43a to the rearward side of the filter antenna port 2b and directs toward the piezoelectric substrate 11 side is formed.

The connecting lines 91 and 92 are respectively formed by being patterned on the piezoelectric substrates 11 and 12, and bumps 83 and 84 are respectively formed on end portions of the connecting lines 91 and 92. Further, when the piezoelectric substrates 11 and 12 are mounted on the package, the ground ports 33c and 43a are electrically connected via the bumps 85 and 86, and the conductive path 87 provided in the package, similarly as in the duplexer 1 in FIG. 10. Also in this example, a projection area of the conductive path 87 to the piezoelectric substrate 10 is positioned on extensions of the connecting lines 91 and 92, namely, on the rearward side of the filter antenna ports 2a and 2b when the piezoelectric substrate 10 is supported by being mounted on the package.

(Evaluation Test)

Figure 12:
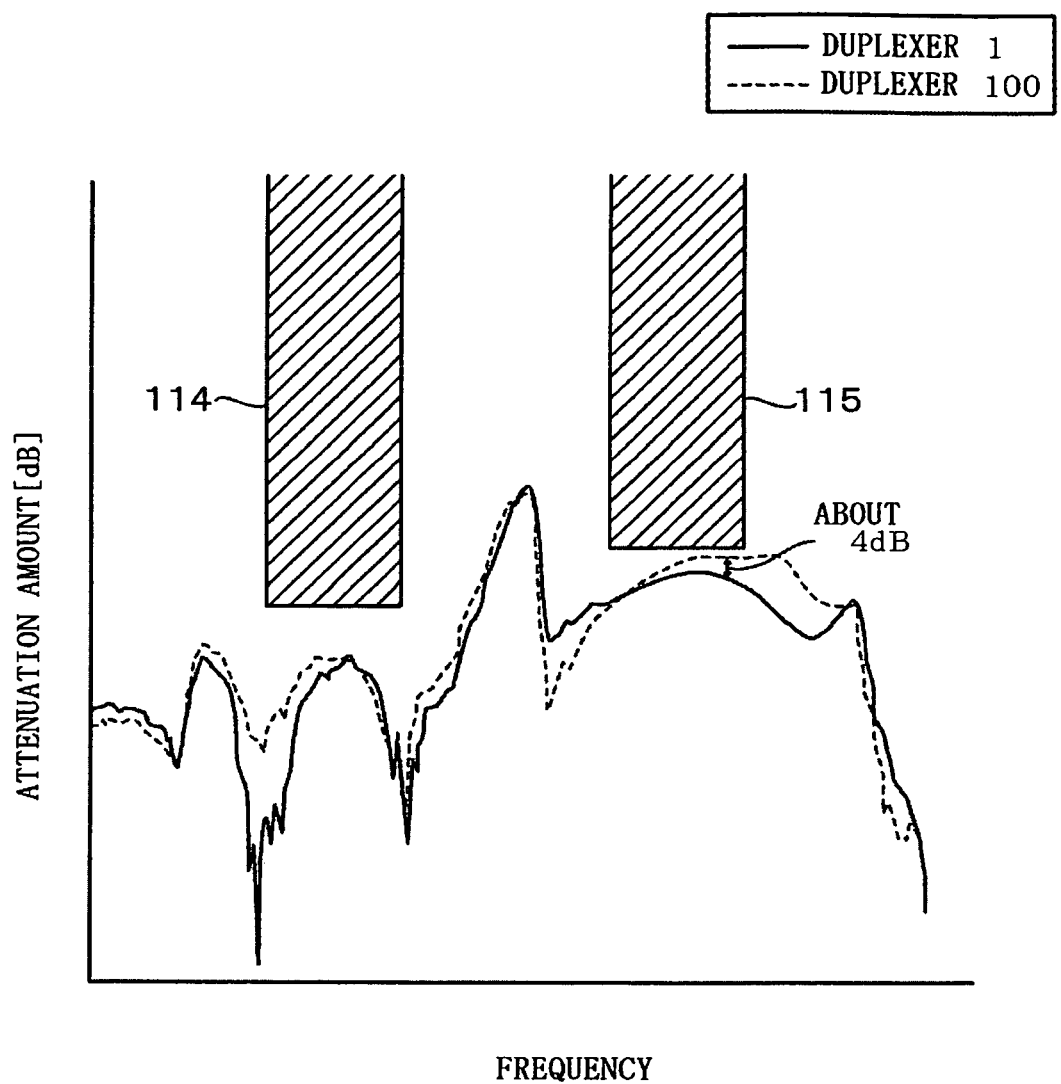
FIG. 12 is a graph showing an isolation characteristic of the duplexer of the present invention and that of a conventional duplexer.
Figure 13:
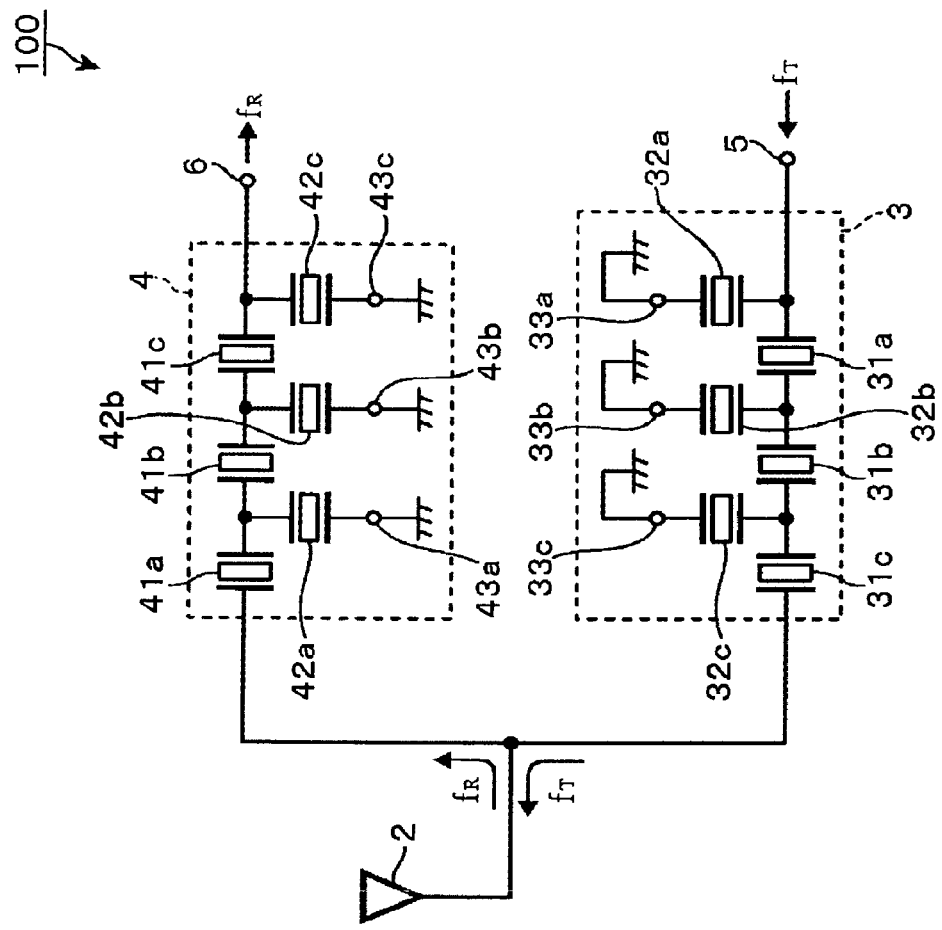
FIG. 13 is a circuit diagram of the conventional duplexer.
Figure 14:
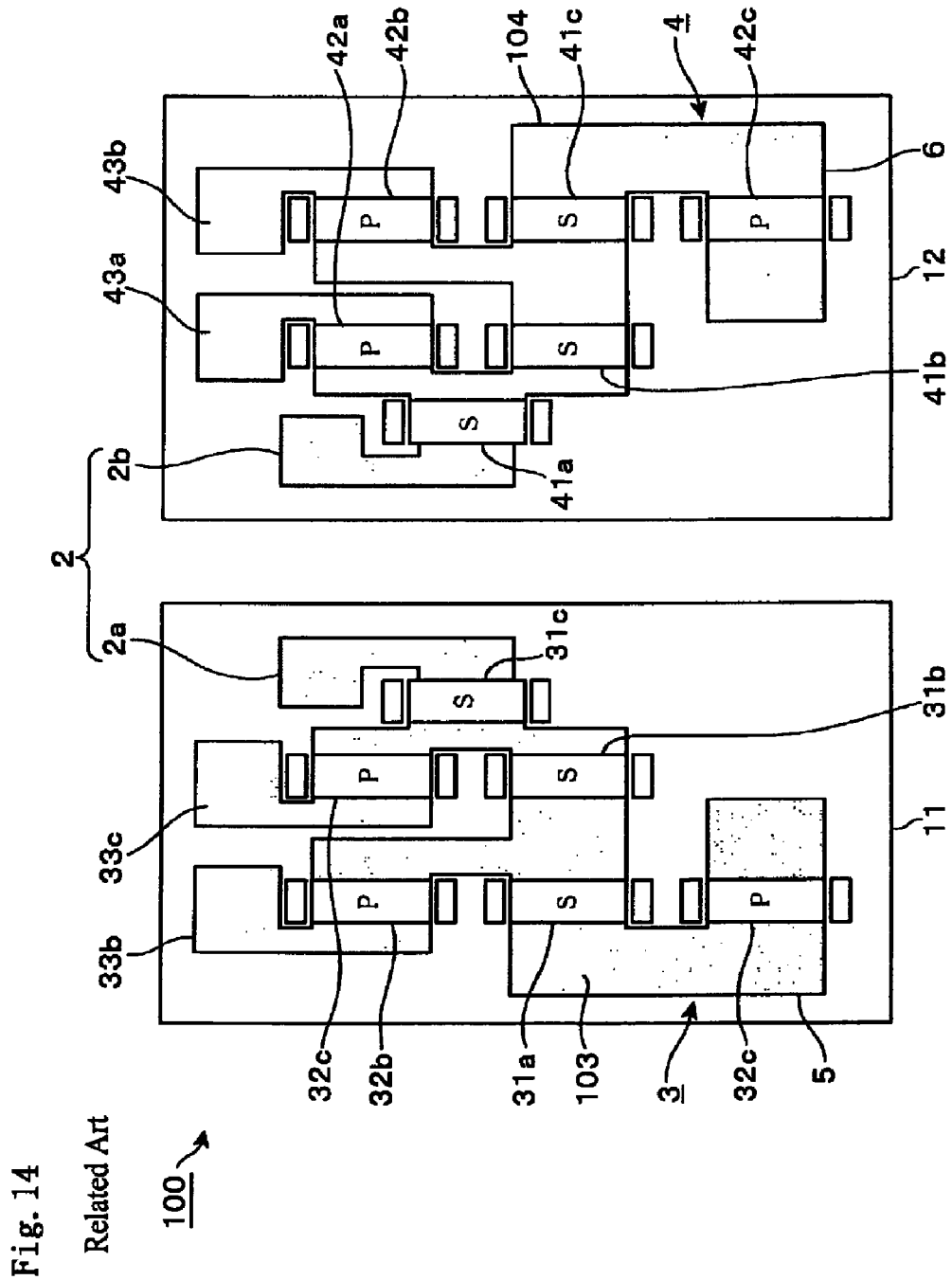
FIG. 14 is a plan view of a substrate that forms the duplexer.
Figure 16:
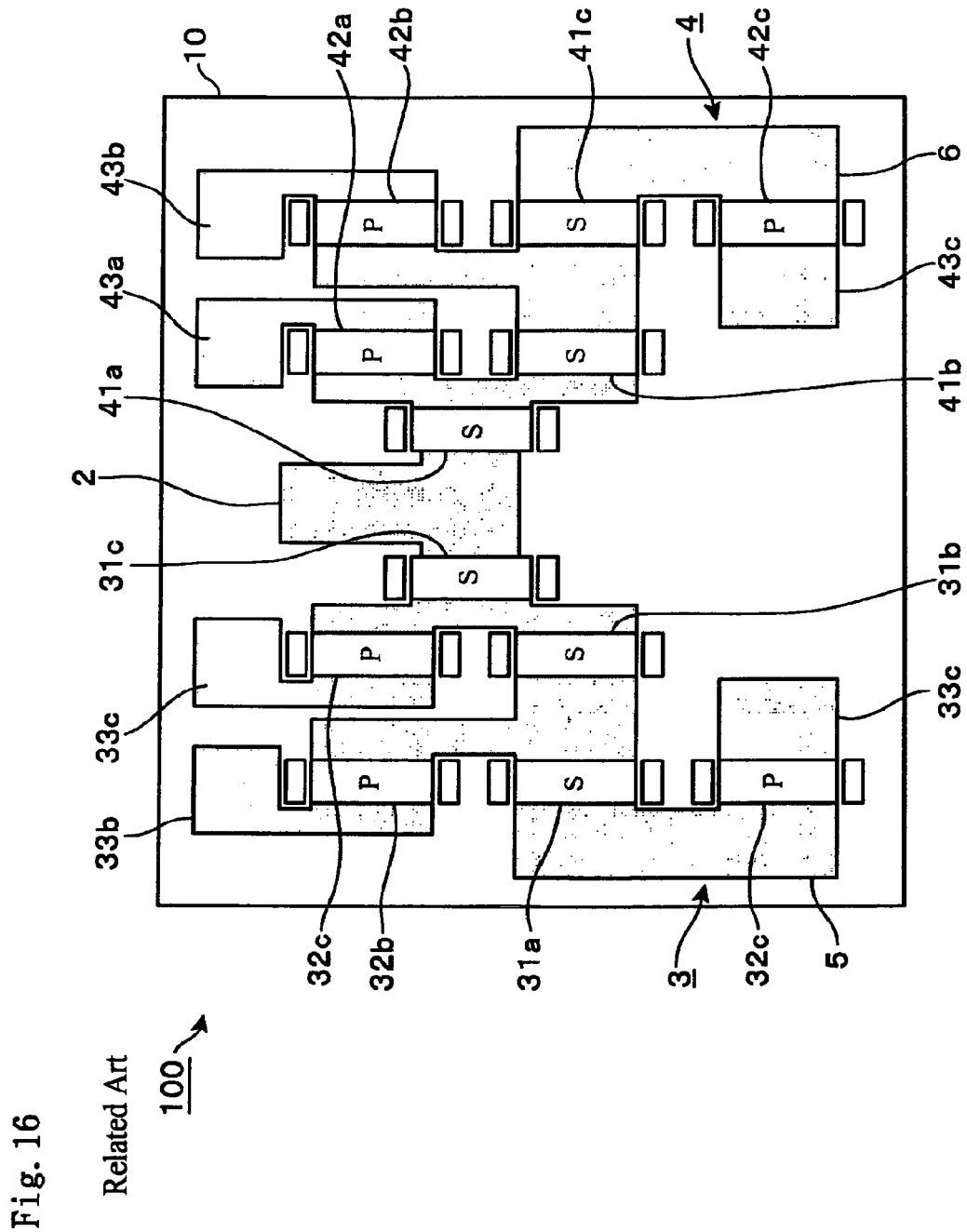
FIG. 16 is an example of another configuration example of the duplexer.

The isolation characteristic of the duplexer 1 shown in FIG. 1 and FIG. 2 and the isolation characteristic of the duplexer 100 shown in FIG. 16 are respectively measured. FIG. 12 is a graph showing the measurement result, in which a horizontal axis and a vertical axis respectively indicate a frequency and the isolation characteristic. In the graph of the drawing, a solid line and a dotted line respectively indicate the isolation characteristic of the duplexer 1 and that of the duplexer 100. As shown by an arrow mark in the graph, the isolation characteristic at the high band side in the duplexer 1 is improved by about 4 dB compared to that in the duplexer 100, which proves the effect of the present invention.

What is claimed is:

1. A duplexer formed on a piezoelectric substrate, the duplexer comprising:
    an antenna port formed on a center portion toward a rearward side of the piezoelectric substrate;
    a first signal port positioned more forward than the antenna port;
    a second signal port positioned more forward than the antenna port;
    a low band side filter provided at one side relative to a center of the antenna port between the first signal port and the antenna port and formed of a ladder-type filter including elastic wave resonators that form series arms and elastic wave resonators that form parallel arms, wherein a first parallel arm is formed at a stage closest to the first signal port and a second parallel arm is formed at a stage closer to the antenna port than the stage closest to the first signal port; and
    a high band side filter having a pass band higher than that of the low band side filter, provided at another side relative to the center of the antenna port opposite said one side between the second signal port and the antenna port, and formed of a ladder-type filter including elastic wave resonators that form series arms and elastic wave resonators that form parallel arms, wherein a third parallel arm is formed at a stage closest to the second signal port and a fourth parallel arm is formed at a stage closer to the antenna port than the stage closest to the second signal port; and
    wherein a ground side of the second parallel arm and a ground side of the fourth parallel arm are mutually connected via a conductive path that is formed toward the rearward side, rearward of the antenna port, away from a forward side of the first signal port and away from a forward side of the second signal port, the second parallel arm provided at a position rearward of the first parallel arm and the fourth parallel arm provided at a position rearward of the third parallel arm.

2. The duplexer according to claim 1, further comprising a supporting member supporting the piezoelectric substrate, the supporting member having a conductive member positioned rearward of the antenna port, the conductive path comprising the conductive member.

3. The duplexer according to claim 1, wherein the conductive path mutually connects ground ports which are respectively disposed at said one side and said another side relative to said center of the antenna port to ground the second and fourth parallel arms.

4. A duplexer formed on a piezoelectric substrate, the duplexer comprising:
    an antenna port formed on a center portion toward a rearward side of the piezoelectric substrate;
    a first signal port positioned more forward than the antenna port;
    a second signal port positioned more forward than the antenna port;
    a low band side filter provided at one side relative to a center of the antenna port between the first signal port and the antenna port and formed of a ladder-type filter including resonant elements that form series arms and resonant elements that form parallel arms; and
    a high band side filter having a pass band higher than that of the low band side filter, provided at another side relative to the center of the antenna port opposite said one side between the second signal port and the antenna port, and formed of a ladder-type filter including resonant elements that form series arms and resonant elements that form parallel arms;
    wherein one series arm of a first series arm in the low band side filter formed at a first stage closest to the first signal port and a second series arm in the high band side filter formed at a second stage closest to the second signal port is a longitudinal mode resonant filter, and the other resonant elements of the low band side filter and high band side filter are elastic wave resonators, said one series arm positioned more forward than the antenna port;
    wherein a first parallel arm in one of the low band side filter and high band side filter without said one series arm is positioned more forward than the antenna port;
    wherein a second parallel arm, at a stage closer to the antenna port than the longitudinal mode resonant filter in one of the low band side filter and high band side filter with said longitudinal mode resonant filter, is mutually connected at its ground side via a conductive path to a ground side of one parallel arm of a third parallel arm and a fourth parallel arm, the third parallel arm positioned at a stage closer to the antenna port than the first stage and the fourth parallel arm positioned at a stage closer to the antenna port than the second stage, said one parallel arm being the third parallel arm in embodiments where the longitudinal mode resonant filter is in the high band side filter and being said fourth parallel arm in embodiments where the longitudinal mode resonant filter is in the low band side filter, the conductive path formed toward the rearward side of the piezoelectric substrate, rearward of the antenna port, away from a forward side of the first signal port and away from a forward side of the second signal port; and
    wherein said one parallel arm is positioned rearward of the first parallel arm and said second parallel arm is positioned rearward of the longitudinal mode resonant filter.

5. A duplexer formed on a piezoelectric substrate, the duplexer comprising:
    an antenna port formed on a center portion toward a rearward side of the piezoelectric substrate;
    a first signal port positioned more forward than the antenna port;
    a second signal port positioned more forward than the antenna port;
    a low band side filter provided at one side relative to a center of the antenna port between the first signal port and the antenna port and formed of a ladder-type filter including resonant elements that form series arms and resonant elements that form parallel arms; and
    a high band side filter having a pass band higher than that of the low band side filter, provided at another side relative to the center of the antenna port opposite said one side between the second signal port and the antenna port, and formed of a ladder-type filter including resonant elements that form series arms and resonant elements that form parallel arms;
    wherein a first series arm in the low band side filter formed at a first stage closest to the first signal port is a longitudinal mode resonant filter, and a second series arm in the high band side filter formed at a second stage closest to the second signal port is a longitudinal mode resonant filter, and the other resonant elements of the low band side filter and high band side filter are elastic wave resonators, said first series arm and said second series arm positioned more forward than the antenna port;

wherein a first parallel arm, positioned at a stage closer to the antenna port than the longitudinal mode resonant filter in the low band side filter, is mutually connected at its ground side via a conductive path to a ground side of a second parallel arm, positioned at a stage closer to the antenna port than the longitudinal mode resonant filter in the high band side filter;

wherein the conductive path is formed toward the rearward side of the piezoelectric substrate, rearward of the antenna port, away from a forward side of the first signal port and away from a forward side of the second signal port; and wherein said first parallel arm is positioned rearward of the longitudinal mode resonant filter in the low band side filter, and a second parallel arm is positioned rearward of the longitudinal mode resonant filter in the high band side filter.

6. A duplexer comprising a first piezoelectric substrate, a second piezoelectric substrate, and a supporting member supporting the first piezoelectric substrate and the second piezoelectric substrate;

the first piezoelectric substrate comprising thereon:
  a first antenna port formed a portion toward a rearward side of the first piezoelectric substrate and toward the second piezoelectric substrate;
  a first signal port positioned more forward than the first antenna port; and
  a low band side filter provided at one side relative to a center of the first antenna port between the first signal port and the first antenna port and formed of a ladder-type filter including elastic wave resonators that form series arms and elastic wave resonators that form parallel arms, wherein a first parallel arm is formed at a stage closest to the first signal port and a second parallel arm is formed at a stage closer to the first antenna port than the stage closest to the first signal port;

the second piezoelectric substrate comprising thereon:
  a second antenna port formed a portion toward a rearward side of the second piezoelectric substrate and toward the first piezoelectric substrate;
  a second signal port positioned more forward than the second antenna port; and
  a high band side filter having a pass band higher than that of the low band side filter, provided at another side relative to the center of the second antenna port opposite said one side between the second signal port and the second antenna port, and formed of a ladder-type filter including elastic wave resonators that form series arms and elastic wave resonators that form parallel arms, wherein a third parallel arm is formed at a stage closest to the second signal port and a fourth parallel arm is formed at a stage closer to the second antenna port than the stage closest to the second signal port; and the supporting member comprising:
  a conductive member having a member conductive path coupled to a first conductive path of the first piezoelectric substrate and a second conductive path of the second piezoelectric substrate, the first conductive path formed toward the rearward side of the first piezoelectric substrate, rearward of the first antenna port, away from a forward side of the first signal port, the second conductive path formed toward the rearward side of the second piezoelectric substrate, rearward of the second antenna port, away from a forward side of the second signal port:

wherein a ground side of the second parallel arm and a ground side of the fourth parallel arm are mutually connected via the member conductive path, first conductive path and second conductive path;

wherein the second parallel arm is provided at a position rearward of the first parallel arm and the fourth parallel arm is provided at a position rearward of the third parallel arm.

* * * * *